(12) United States Patent
Matsuda et al.

(10) Patent No.: US 11,791,148 B2
(45) Date of Patent: Oct. 17, 2023

(54) VARIABLE REDUCTION RATIO SPHERICAL ABERRATION CORRECTION ELECTROSTATIC LENS, WIDE ANGLE ENERGY ANALYZER, AND TWO-DIMENSIONAL ELECTRON SPECTROMETER

(71) Applicant: NATIONAL UNIVERSITY CORPORATION NARA INSTITUTE OF SCIENCE AND TECHNOLOGY, Nara (JP)

(72) Inventors: Hiroyuki Matsuda, Nara (JP); Hiroshi Daimon, Nara (JP); Laszlo Toth, Debrecen (HU)

(73) Assignee: University Corporation National Nara Institute of Science and Technology, Nara (JP)

( * ) Notice: Subject to any disclaimer, the term of this patent is extended or adjusted under 35 U.S.C. 154(b) by 0 days.

(21) Appl. No.: 17/053,270

(22) PCT Filed: Aug. 5, 2019

(86) PCT No.: PCT/JP2019/018418
§ 371 (c)(1),
(2) Date: Nov. 5, 2020

(87) PCT Pub. No.: WO2019/216348
PCT Pub. Date: Nov. 14, 2019

(65) Prior Publication Data
US 2021/0193448 A1    Jun. 24, 2021

(30) Foreign Application Priority Data

May 9, 2018   (JP) ................................ 2018-091020
May 8, 2019   (WO) .................. PCT/JP2019/018418

(51) Int. Cl.
   H01J 49/06    (2006.01)
   H01J 49/48    (2006.01)

(52) U.S. Cl.
   CPC .......... H01J 49/067 (2013.01); H01J 49/482 (2013.01)

(58) Field of Classification Search
   CPC ........ H01J 37/12; H01J 37/252; H01J 49/067; H01J 49/482; G01N 23/227
   See application file for complete search history.

(56) References Cited

U.S. PATENT DOCUMENTS 6,492,644 B1 * 12/2002 Staib ..................... H01J 37/252
                                                          250/305
2006/0255269 A1   11/2006 Kawasaki et al.
(Continued)

FOREIGN PATENT DOCUMENTS

WO       2008013232 A1     1/2008
WO   WO-2017010529 A1 *    1/2017   ........... G01N 23/227

OTHER PUBLICATIONS

H. Daimon, "New display-type analyzer for the energy and the angular distribution of charged particles", Rev. Sci. Instrum., vol. 59, No. 4 (1988) 545-549.
(Continued)

*Primary Examiner* — David E Smith
(74) *Attorney, Agent, or Firm* — Ogilvie Law Firm

(57) ABSTRACT

Provided is a compact two-dimensional electron spectrometer that is capable of variably adjusting the deceleration ratio over a wide range, and performing simultaneous measurement of the two-dimensional emission angle distribution with a high energy resolution over a wide solid angle of acquisition. The two-dimensional electron spectrometer is configured from: a variable deceleration ratio spherical aberration correction electrostatic lens; a cylindrical mirror type energy analyzer or a wide angle energy analyzer; and a
(Continued)

projection lens. The variable deceleration ratio spherical aberration correction electrostatic lens is configured from: an electrostatic lens that consists of an axially symmetric spherical mesh having a concave shape with respect to a point source, and one or a plurality of axially symmetrical electrodes, and that adjusts the spherical aberration of charged particles generated from the point source; and an axially symmetric deceleration field generating electrode that is placed coaxially with the electrostatic lens.

19 Claims, 24 Drawing Sheets

(56) References Cited

U.S. PATENT DOCUMENTS

| | | | |
|---|---|---|---|
| 2008/0135748 A1* | 6/2008 | Daimon | H01J 37/244 |
| | | | 250/311 |
| 2010/0001202 A1* | 1/2010 | Matsuda | H01J 37/12 |
| | | | 250/311 |
| 2018/0211812 A1* | 7/2018 | Matsui | H01J 37/305 |

OTHER PUBLICATIONS

H. Matsuda et al., "Development of display-type ellipsoidal mesh analyzer", e—J. Surf. Sci. Nanotech. vol. 9 (2011) 311-314.

H. Matsuda et al., "Approach for simultaneous measurement of two-dimensional angular distribution of charged particles: Spherical aberration correction using an ellipsoidal mesh", Phys. Rev. E71 (2005) 066503.

H. Matsuda et al., "Approach for simultaneous measurement of two-dimensional angular distribution of charged particles. II. Deceleration and focusing of wide-angle beams using a curved mesh lens", Phys. Rev. E 74, (2006) 036501.

H. Matsuda et al., "Development of display-type ellipsoidal mesh analyzer: Computational evaluation and experimental validation", Journal of Electron Spectroscopy and Related Phenomena, vol. 195, (2014) 382-398.

* cited by examiner (a) Deceleration ratio 1/5

(b) Deceleration ratio 1/10

(c) Deceleration ratio 1/20

(d) Deceleration ratio 1/50

(e) Deceleration ratio 1/100

(a) Deceleration ratio 1/5

(b) Deceleration ratio 1/10

(c) Deceleration ratio 1/20

(d) Deceleration ratio 1/50

(e) Deceleration ratio 1/100

(a) Deceleration ratio 1/10

(b) Deceleration ratio 1/20

(c) Deceleration ratio 1/50

(d) Deceleration ratio 1/100

(a) Deceleration ratio 1/10

(b) Deceleration ratio 1/20

(c) Deceleration ratio 1/50

(d) Deceleration ratio 1/100

(a) Deceleration ratio 1/10

(b) Deceleration ratio 1/20

(c) Deceleration ratio 1/50

(d) Deceleration ratio 1/100

(a) Diffraction mode (b) Imaging mode (a) Deceleration ratio 1/5

(b) Deceleration ratio 1/50

(a)

(b)

(a)

(b)

(1)

(2)

(a) K=1.31

(b) K=1.33

(1)

(2) Figure 20(a) of Non-patent literature 1

VARIABLE REDUCTION RATIO SPHERICAL ABERRATION CORRECTION ELECTROSTATIC LENS, WIDE ANGLE ENERGY ANALYZER, AND TWO-DIMENSIONAL ELECTRON SPECTROMETER

TECHNICAL FIELD

The present invention relates to electron spectrometers for such as XPS (X-ray photoelectron spectroscopy) and AES (Auger electron spectroscopy).

BACKGROUND ART

An electron spectrometer measures the energy distribution and emission angle distribution of electrons emitted from a sample to determine the composition and the chemical bond state of elements in the surface and the depth directions of the sample and, furthermore, the energy band structure and the atomic arrangement structure. It is a device that can perform detailed electronic and structural analysis, and various types of devices have been developed in pursuit of performance, efficiency, and convenience.

An electrostatic lens called an input lens is often used at the incident part of an energy analyzer in an electron spectroscopy apparatus and this electrostatic lens takes in as much electrons as possible and lets the electrons enter into the analyzer after deceleration in order to improve the energy resolution.

In ordinary electrostatic lenses, the acceptance angle is limited to about ±20° due to the difficulty of focusing a beam with a large divergence angle to one point due to the spherical aberration, however, the acceptance angle has been improved to about ±30° and the sensitivity can be increased, by using a spherical mesh (Refer to Patent literature 1).

It is also known that a spherical aberration correction electrostatic lens realizing a wider acceptance angle than using a spherical mesh is possible by applying the spherical aberration correction effect of the aspherical mesh and creating an optimum electric field using a plural number of electrodes (Refer to Patent literature 2, 3 and Non-Patent literature 1).

By using the electrostatic lens disclosed in Patent literature 3, it becomes possible to collect charged particles emitted from one point with a large acceptance angle and then decelerate and focus them. FIG. 27 shows an example of a conventional spherical aberration correction deceleration type electrostatic lens. Here, the acceptance angle is set to ±50°. This lens is composed of the 0th electrode to the 4th electrode (EL0 to EL4), and the 0th electrode is provided with a rotating ellipsoidal mesh. The 0th electrode (EL0) is set at the ground potential, and appropriate negative or positive voltages for decelerating and focusing the charged particles are applied to the 1st to 4th electrodes (EL1 to EL4). More specifically, in the case of negatively charged particles, appropriate negative voltages are applied to the first to the fourth electrodes (EL1 to EL4), and in the case of positively charged particles, appropriate positive voltages are applied to the first to the fourth electrodes (EL1 to EL4). The state of the deceleration type convergent electric field generated by applying these voltages is shown by equipotential lines in the figure.

The spherical aberration correction deceleration type electrostatic lens is composed of axisymmetric electrodes like a general electrostatic lens, and the equipotential surface is a rotating surface obtained by rotating an equipotential line around the central axis of the electrostatic lens. In a normal spherical aberration correction deceleration type electrostatic lens, the substantial distribution area of the deceleration type convergent electric field is a region having a spread of about the inner diameter of the electrostatic lens from the mesh electrode (Mesh) as shown in FIG. 27. When charged particles with incidence angles in a wide range pass through the mesh electrode, they receive force in the inner direction perpendicular to the equipotential surface, are bent while being monotonically decelerated, and focus at the exit of the electrostatic lens. At this time, the kinetic energy of the charged particles is $\varepsilon E_k$ ($0<\varepsilon<1$).

Here, $E_k$ is the kinetic energy at the entrance of the electrostatic lens, and $\varepsilon$ is the ratio of the kinetic energy at the exit to $E_k$ (hereinafter, $\varepsilon$ is referred to as a deceleration ratio). In the present specification, a high deceleration ratio means a small value of $\varepsilon$, and a low deceleration ratio means a large value of $\varepsilon$.

In the spherical aberration correction deceleration type electrostatic lens shown in FIG. 27, the deceleration ratio $\varepsilon$ is determined by the voltage applied to the fourth electrode (EL4). Since a voltage of −794V is applied to the fourth electrode (EL4) for 1 keV of electrons, the deceleration ratio $\varepsilon$ of this spherical aberration correction deceleration type electrostatic lens is (1000−794)/1000=about 1/5. In the spherical aberration correction deceleration type electrostatic lens shown in FIG. 27, it is possible to change the deceleration ratio $\varepsilon$, but in this case, there is a problem that the focusing property is remarkably lowered and it becomes difficult to focus the charged particles over a wide incident angle range.

On the other hand, in order to analyze the characteristics and functions of a material in detail from a microscopic viewpoint such as an atomic arrangement structure and a band structure, an analyzer having a high energy resolution is required. This is because the microscopic structure such as the atomic arrangement structure and the band structure is different even if the difference in the binding energy of electrons is as small as about 1 eV or less and this can have a great influence on physical properties. An absolute resolution of at least 0.1 to 0.3 eV is required to clearly distinguish and measure different atomic and electronic structures with a difference in the electron binding energy of about 1 eV or less.

The relative resolution required for the analyzer to obtain the absolute resolution of 0.1 eV is 1/1000 when the kinetic energy is 100 eV, and 1/10000 when the kinetic energy is keV. In X-ray Photoelectron Diffraction (XPD) and photoelectron holography, it is possible to obtain information on the atomic arrangement structure around a specific atom by measuring the emission angle distribution of photoelectrons. For that purpose, it is necessary to set the emission energy to more than several hundred eV. In order to achieve high energy resolution in such an energy region, it is necessary to reduce the kinetic energy of the electrons emitted from the sample before they are incident on the energy selecting part. Here, the energy selecting part distributes the orbits of charged particles according to the kinetic energy, and selects charged particles with a specific energy by inserting a slit or an aperture.

The concentric hemispherical analyzer (CHA; Concentric Hemispherical Analyzer) is the most widely used electron spectrometer. In the case of CHA, the electrostatic hemispherical part composed of two hemispheres having different radii corresponds to the energy selecting part. In general, it is possible to improve the energy resolution by increasing the size of the energy selecting part, but in view of the manufacturing cost, maintenance cost, and convenience, the device size cannot be increased so much. Therefore, in various energy analyzers including CHA, the relative resolution of the energy selecting part is only about 1/200 (which corresponds to a relatively small energy analyzer) to 1/1000 .

The advantage of CHA is that high energy resolution can be easily achieved, but on the other hand, the efficiency of measuring the emission angle distribution is extremely low, and it has been pointed out that it is a major obstacle to performing more advanced analysis.

As is described above, it is difficult to obtain high energy resolution only by the action of the energy selecting part. Therefore, in CHA, deceleration can be performed by an input lens combined with the electrostatic hemispherical part. In an analyzer with a relative resolution of 1/200 to 1/1000 of the energy selecting part, if the kinetic energy of charged particles can be reduced to 1/10 by deceleration, a resolution of 1/2000 to 1/10000 of incident energy becomes possible.

The possible absolute resolution $\Delta E$ is expressed by $\Delta E = r \varepsilon E_k$ using the relative resolution r of the energy selecting part, the deceleration ratio $\varepsilon$, and the incident energy $E_k$. The required deceleration ratio $\varepsilon$ is calculated from this equation and the required absolute resolution. The kinetic energy $E_k$ suitable for XPD and photoelectron holography is about 500 eV to 1000 eV. In order to achieve an absolute resolution of 0.1 eV at $E_k=1$ keV, a deceleration ratio of about 1/10 to 1/50 is required, as seen from the equation $\Delta E = r \varepsilon E_k$. Here, it is presumed that a high deceleration ratio of about 1/50 is necessary when trying to realize a compact analyzer with high energy resolution. Further, when trying to achieve a resolution of about 0.1 eV or less in an energy region higher than 1000 eV, a higher deceleration ratio is required.

In general, a high deceleration ratio setting is expected to have a high energy resolution, but the detection sensitivity may be significantly reduced as compared with the case of a low deceleration ratio. Therefore, it is preferable that the deceleration ratio can be widely changed, such that the deceleration ratio is set low in measurement where low energy deceleration does not matter, and the deceleration ratio is set high only when measurement with high energy resolution is required.

PRIOR ART

Patent Literature

[Patent literature 1] JP1996-111199A
[Patent literature 2] JP4802340B
[Patent literature 3] JP4900389B
[Non-patent literature]
[Non-patent literature 1] H. Matsuda et al., "Development of display-type ellipsoidal mesh analyzer: Computational evaluation and experimental validation", Journal of Electron Spectroscopy and Related Phenomena, Volume 195, Page 382-398, August (2014).

OUTLINE OF THE INVENTION

Problems to be Solved by the Invention

In order to realize an electron spectrometer capable of simultaneously measuring the emission angle distribution over a wide acceptance solid angle with high energy resolution, the focusing performance of the electrostatic lens is important. Normally, an energy analyzer inserts a slit or aperture at the entrance of the energy selecting part to achieve high energy resolution, but when the spread due to spherical aberration of the electrostatic lens generated at the entrance is larger than the slit width or aperture diameter, angular information is lost.

As described above, in a normal electrostatic lens, spherical aberration is large, and the acceptance angle is limited to ± several degrees or less. However, it is possible to increase the sensitivity by using a spherical mesh, and furthermore, in a spherical aberration correction electrostatic lens with an aspherical mesh as shown in FIG. 27, an optimum electric field is created by using a plurality of electrodes to realize a wide acceptance angle, and spherical aberration can be almost completely corrected over an acceptance angle of ±50°.

However, in the case of the spherical aberration correction deceleration type electrostatic lens as shown in FIG. 27, the deceleration ratio is fixed at about 1/5. Although a higher deceleration ratio is required to achieve higher energy resolution, the focusing properties of the electrostatic lens is significantly lowered when the lens is set for a higher deceleration ratio.

Further, the current configuration of two-dimensional electron spectroscopy apparatus has a problem that the apparatus size is considerably large. As the apparatus size increases, the manufacturing cost and maintenance cost increase, and the installation location is also greatly restricted.

Furthermore, in a two-dimensional electron spectrometer, the measurement of the two-dimensional angle pattern with high energy resolution is performed by letting the wide angle two-dimensional angle pattern output of the electrostatic lens incident on CHA, but what can be obtained by the CHA is a one-dimensional angle pattern that passes through an elongated slit, and in order to reconstruct the two-dimensional angle pattern, a deflector is used to gradually change the position of the two-dimensional pattern to acquire a large number of one-dimensional patterns. This takes a lot of time and makes it impossible to perform real time observation.

In view of the above problems, the present invention aims to present a compact two-dimensional electron spectrometer capable of variably adjusting the deceleration ratio over a wide range and measuring a high-energy-resolution two-dimensional emission angle distribution simultaneously over a wide acceptance solid angle. Also, it is an object of the present invention to provide a variable deceleration ratio spherical aberration correction electrostatic lens and a wide angle energy analyzer constituting the two-dimensional electron spectrometer.

Means to Solve the Objects

In order to solve the problems mentioned above, the variable deceleration ratio spherical aberration correction electrostatic lens of the present invention consists of an aspherical mesh having a concave shape with respect to a point source and being axisymmetric or substantially axisymmetric, and a single or plurality of electrodes axisymmetric or substantially axisymmetric, and is configured with an electrostatic lens that adjusts the spherical aberration of charged particles generated from a point source and an axisymmetric deceleration field generating electrode that is arranged coaxially with the electrostatic lens. Then, the mesh shape and the potential and arrangement of the electrodes are adjusted so that the charged particles generated from the point source focus at the lens exit by the electrostatic lens, and the deceleration field generating electrode is provided in front of the focusing point to adjust the applied potential, by which the deceleration ratio of charged particles can be controlled.

According to the above configuration, the charged particles emitted from the point source can be taken in over a wide solid angle range and the deceleration ratio can be variably adjusted. In the variable deceleration ratio spherical aberration correction electrostatic lens of the present invention, electrons can be focused when negative potentials are applied to the electrodes, and cations can be focused when positive potentials are applied to the electrodes.

The variable deceleration ratio spherical aberration correction electrostatic lens of the present invention can realize the two functions, one is to work as a conventional spherical aberration correction electrostatic lens and the other is to work as an input lens of the energy analyzer.

Here, as a specific aspect of the shape of the aspherical mesh, it is substantially spheroid whose major axis is from the vicinity of the center of the mesh opening to the position of the center of the mesh, and the vicinity of the mesh opening has an inwardly convex curvature. By adjusting the mesh shape, the potential and the arrangement of the electrodes, it becomes possible to focus specific-energy charged particles over a wide acceptance angle of about ±60°.

Note that the shape parameters of the aspherical mesh are disclosed in Patent literatures 2 and 3, and Non-Patent literature 1 described above.

It is preferable that the deceleration field generating electrode in the variable deceleration ratio spherical aberration correction electrostatic lens of the present invention is provided with a planar grid that crosses the path of charged particles, and the electrostatic lens and the planar grid are arranged on the same axis so that the charged particles are incident on the planar grid. In conventional electrostatic lenses, the focusing angle increases as the deceleration ratio increases, but by providing a planar grid, the focusing angle can be kept almost constant regardless of the deceleration ratio, which enables to greatly increase the energy resolution.

The planar grid may be provided with a mechanism by which the grid can be inserted from the outside of the electrostatic lens and also be removed.

Further, the planar grid may be composed of a plurality of grid-equipped openings having different opening sizes and a switching mechanism of the openings.

Further, the planar grid may consist of an opening with a grid having a variable opening area, and the size of the grid may be changed by narrowing the opening area.

The variable deceleration ratio spherical aberration correction electrostatic lens of the present invention may be further provided with a plurality of openings having different aperture sizes that limit the acceptance angle of charged particles generated from a point source and a switching mechanism of openings, and the acceptance angle of charged particles can be controlled by changing the opening.

In the variable deceleration ratio spherical aberration correction electrostatic lens of the present invention, the deceleration field generating electrode for controlling the deceleration ratio may have at least a two-stage configuration.

Next, the two-dimensional electron spectrometer of the present invention will be described.

The two-dimensional electron spectrometer of the present invention is composed of the above-mentioned variable deceleration ratio spherical aberration correction electrostatic lens of the present invention and a projection lens disposed on the exit side of the electrostatic lens.

The two-dimensional electron spectrometer of the present invention is preferably provided further with an energy analyzer having a 1-to-1 linear relationship between an incident angle and an emission angle, as is seen in devices such as a cylindrical mirror type energy analyzer (CMA) and a concentric hemispherical analyzer (CHA), and the energy analyzer is placed on the exit side of the electrostatic lens and a projection lens is placed on the exit side of the energy analyzer. By arranging the projection lens after the energy analyzer, it is possible to simultaneously measure the two-dimensional emission angle distribution over a wide acceptance solid angle.

Here, the cylindrical mirror type energy analyzer (CMA) is usually characterized by two cylindrical electrodes having different radii being arranged coaxially, and the electron gun is usually disposed inside the inner cylindrical electrode, with a configuration in which the sample placed on the analyzer axis is irradiated with an electron beam (see FIG. 28). Auger electrons emitted from the sample by irradiation with an electron beam pass through a cylindrical grid provided in a part of the inner cylinder and enter a cylindrically symmetric electric field, thereafter the electrons are bent by the cylindrically symmetric electric field and focused on the analyzer axis going out of the field through another cylindrical grid provided at the inner cylinder.

Further, as described above, the concentric hemispherical analyzer (CHA) is usually composed of an electrostatic hemispherical part configured of two hemispheres with different radii and an input lens, and the electrostatic hemispherical part functions as an energy selecting part.

The two-dimensional electron spectrometer of the present invention is more preferably provided with a wide angle energy analyzer instead of a cylindrical mirror type energy analyzer.

Here, the wide angle energy analyzer of the present invention uses two toroidal grids instead of the two cylindrical grids of the cylindrical mirror type energy analyzer, and has a configuration in which the axial length of each grid is increased to increase the acceptance angle of charged particles.

By using the wide angle energy analyzer, the acceptance angle becomes about 2 to 10 times that of the cylindrical mirror type energy analyzer, and the variable deceleration ratio spherical aberration correction electrostatic lens can be directly combined with the energy analyzer. By this, the device size can be considerably reduced compared with that of the conventional device, and also, significant improvements in sensitivity and functions can be expected.

Effects of the Invention

According to the variable deceleration ratio spherical aberration correction electrostatic lens of the present invention, there is an effect that charged particles can be focused over a wide acceptance solid angle and the deceleration ratio can be variably adjusted over a wide range.

Further, according to the wide angle energy analyzer of the present invention, there are effects that high energy resolution and significant improvement in sensitivity can be achieved.

Then, according to the two-dimensional electron spectrometer of the present invention, there are effects that the two-dimensional emission angle distribution measurement with high energy resolution can be performed simultane-

BEST MODE FOR CARRYING OUT THE INVENTION

Embodiments of the present invention will be described in detail below with reference to the drawings. The present invention is not limited to the following embodiments and examples of shown in the figures, and the present invention can be variously changed in design.

Embodiment 1

Figure 1:
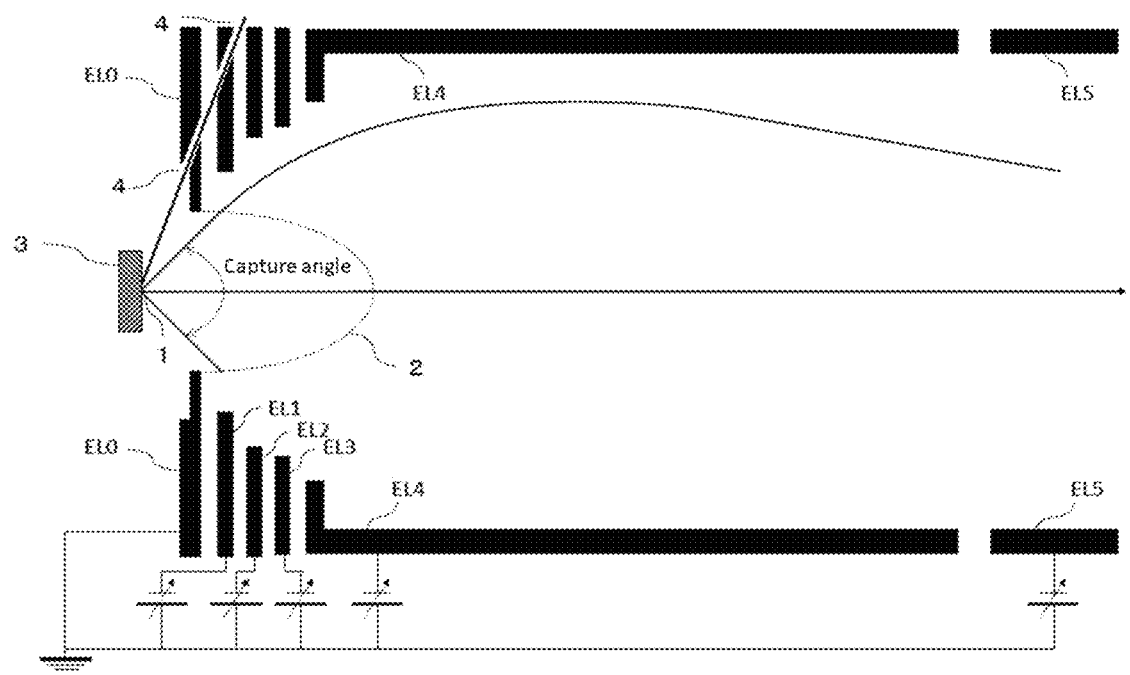
FIG. 1 shows a configuration explanatory view of a variable deceleration ratio spherical aberration correction electrostatic lens.

Firstly, the basic configuration of the variable deceleration ratio spherical aberration correction electrostatic lens will be described with reference to FIG. 1. The variable deceleration ratio spherical aberration correction electrostatic lens is composed of an axisymmetric aspherical mesh 2 that is concave with respect to the point source 1 and six axisymmetric electrodes (EL0 to EL5). When the sample 3 is irradiated with the excitation beam, charged particles (electrons or ions) are emitted with a certain opening angle from the point source 1 which is the irradiation point. The excitation beam irradiates the sample 3 through the hole 4 through which the excitation beam passes. When the acceptance angle of the charged particles generated from the point source 1 is about ±60°, the holes 4 through which the excitation beam passes are arranged so as to be 75° or more with respect to the axis of the lens.

An example of the arrangement and potentials of the electrodes will be described. Each of the electrodes EL0 to EL5 is a coaxial ring-shaped electrode. Of the five electrodes EL0 to EL4 constituting the electrostatic lens, as shown in FIG. 1, the electrode EL0 is connected to the aspherical mesh 2 and to the ground so as to be 0V. This is for setting the potential to be the same as that of the sample 3. The three electrodes EL1 to EL3 are sequentially arranged so as to be getting away from the point source 1, and the inner diameter of the electrode is increased so that the tip portion of the electrode is arranged outside the outer circumference of the electron beam. The electrode EL4 is arranged at the farthest position and has a shape elongated in the axial direction.

The shape of the aspherical mesh will be described. The aspherical mesh 2 is substantially a spheroid whose major axis is from the vicinity of the center of the mesh opening to the mesh center position. The shape of the aspherical mesh 2 is a rotating ellipsoid with a major axis in the axial direction, being different from a spherical shape, to generate an electric field in which the force for charged particles emitted from the point source is relatively increased in the direction to the central axis.

Figure 2:
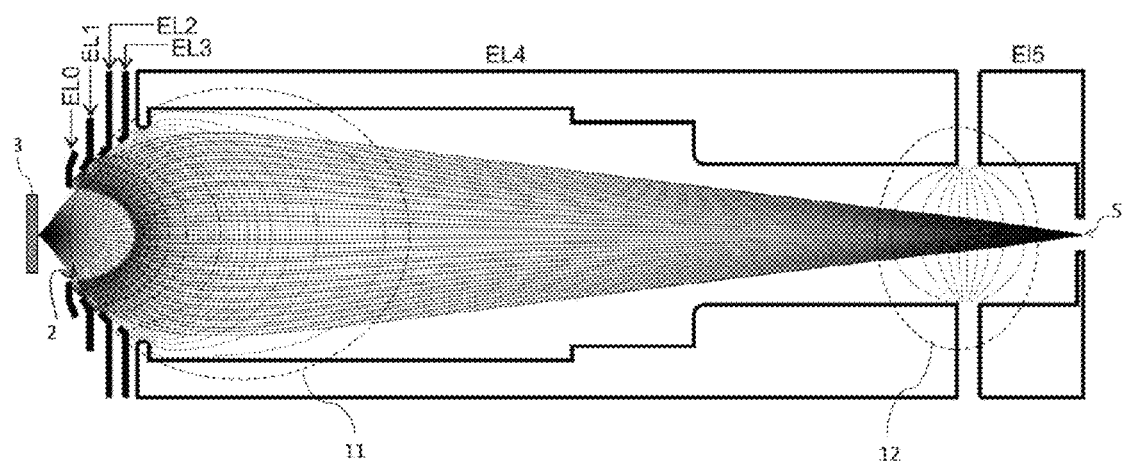
FIG. 2 shows a configuration explanatory view of a variable deceleration ratio spherical aberration correction electrostatic lens of Embodiment 1.

FIG. 2 shows the configuration of the variable deceleration ratio spherical aberration correction electrostatic lens of the Embodiment 1. The variable deceleration ratio spherical aberration correction electrostatic lens of the Embodiment 1 is composed of six electrodes (EL0 to EL5), and has the feature that charged particles having a large divergence angle are decelerated and focused in two steps. In the first stage of the deceleration, the charged particles are decelerated by the deceleration electric field (first deceleration electric field 11) by the five electrodes (EL0 to EL4) on the sample 3 side (first stage deceleration). Here, the charged particles are decelerated to about 1/5 of the energy at the incidence. After that, the charged particles are further decelerated (second stage deceleration) by the deceleration electric field (second deceleration electric field 12) provided on the exit side, and focused at the exit position 5 of the electrostatic lens.

In the Embodiment 1, the deceleration ratio is set at 1/10. With the variable deceleration ratio spherical aberration correction electrostatic lens of this embodiment, it is possible to obtain high focusing by adjusting only the applied voltage at least in the range of 1/5 to 1/20 of the deceleration ratio.

Figure 3:
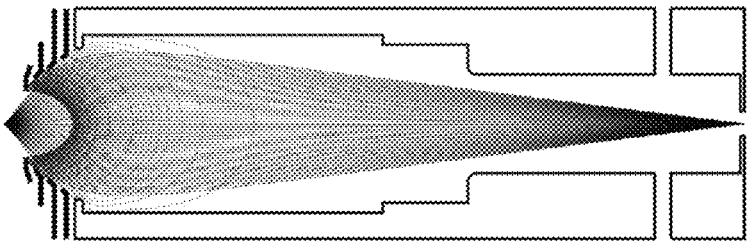
FIG. 3 shows an explanatory view of deceleration ratio of a variable deceleration ratio spherical aberration correction electrostatic lens of Embodiment 1.
Figure 3:
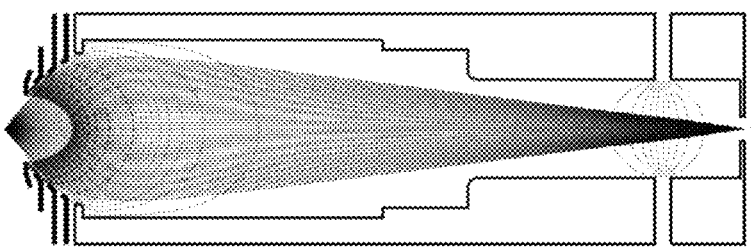
Figure 3:
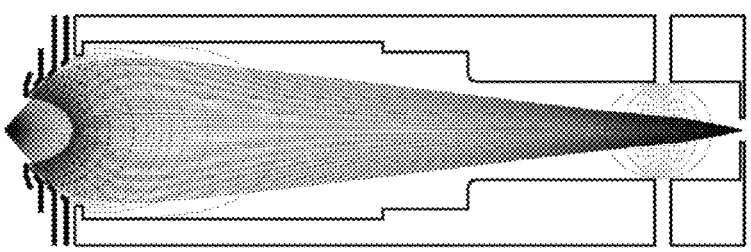
Figure 3:
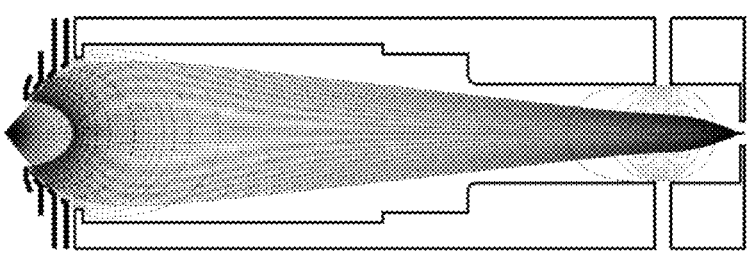
Figure 3:
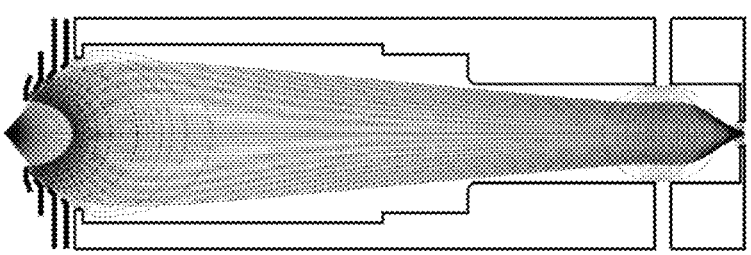
Figure 27:
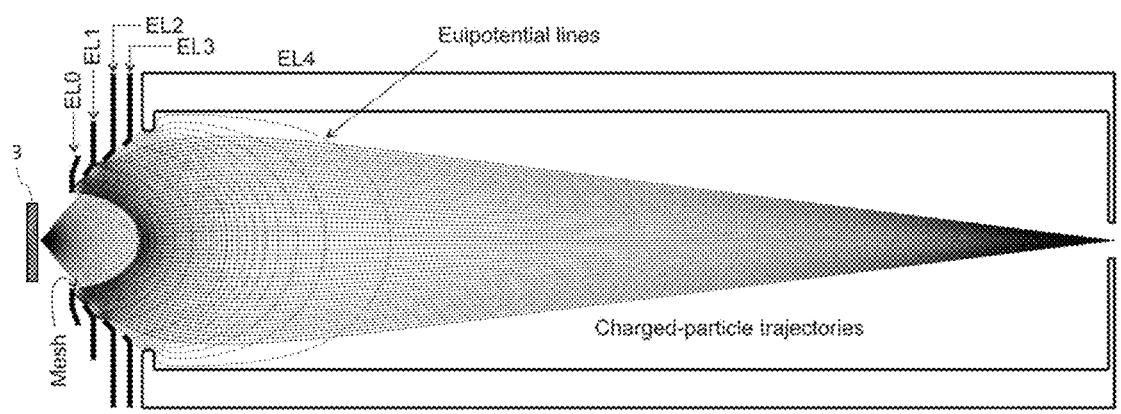
FIG. 27 shows a configuration explanatory view of a conventional spherical aberration correction deceleration type electrostatic lens.

FIG. 3 shows the electric field distribution and the charged particle trajectories obtained by adjusting only the applied voltages at the setting of the deceleration ratio of 1/5 to 1/100 in the variable deceleration ratio spherical aberration correction electrostatic lens of this embodiment. When the deceleration ratio is 1/5 as shown in FIG. 3(a), the second deceleration electric field is eliminated (set to zero) and only the first deceleration electric field is adjusted. The electric field distribution and the charged particle trajectories when the deceleration ratio is 1/5 as shown in FIG. 3(a) are the same as the electric field distribution and the charged particle trajectories of the conventional spherical aberration correction deceleration type electrostatic lens shown in FIG. 27. An important point shown in FIG. 3 is that the focusing angle of the charged particle trajectories increases as the deceleration ratio increases, as clearly shown in FIGS. 3(d) and 3(e). It is also noteworthy that the focusing is significantly degraded when the deceleration ratio is 1/50 to 1/100.

Figure 4:
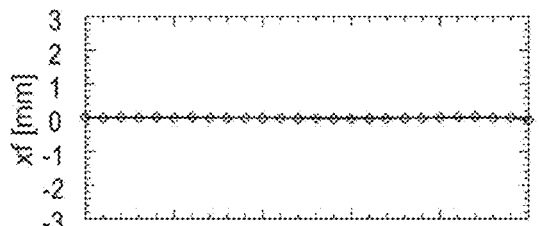
FIG. 4 shows an explanatory view of trajectories of charged particles at the exit of a variable deceleration ratio spherical aberration correction electrostatic lens of Embodiment 1.
Figure 4:
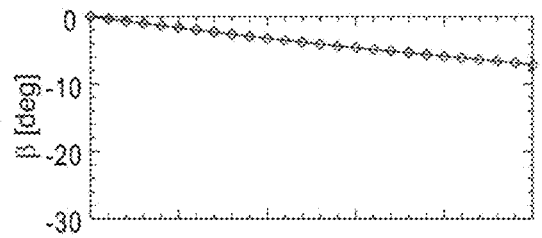
Figure 4:
Figure 4:
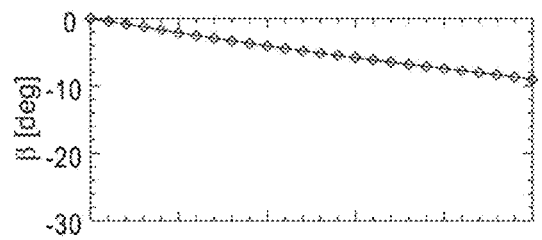
Figure 4:
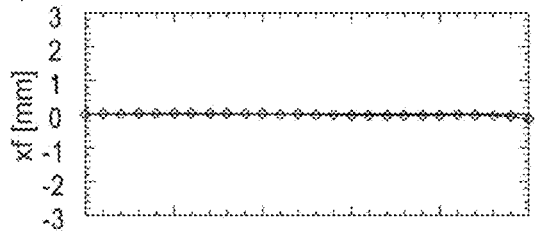
Figure 4:
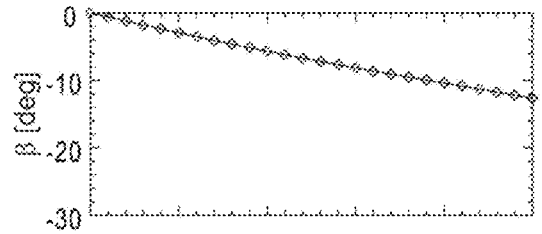
Figure 4:
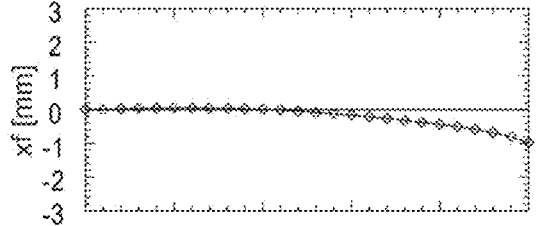
Figure 4:
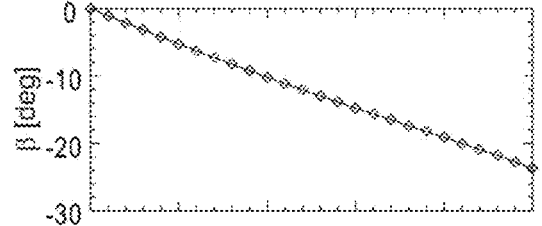
Figure 4:
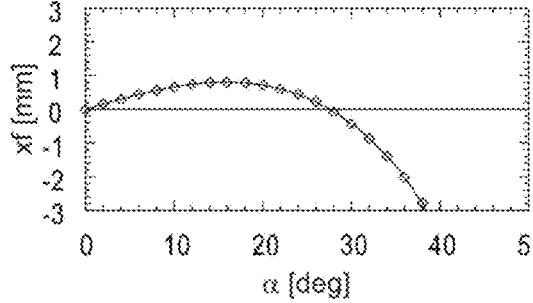
Figure 4:
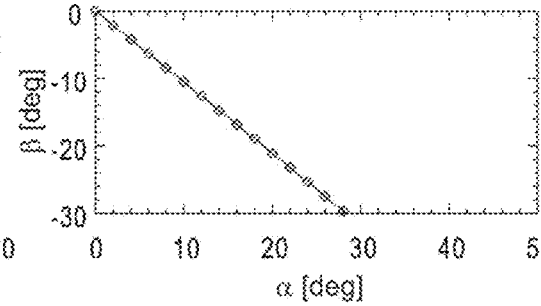

These points are shown more clearly in the graph of FIG. 4. For the electrostatic lens with each deceleration ratio in FIG. 3, the positions where the charged particles entering from the point source 1 with incident angles α [deg] are found at the exit of the electrostatic lens are shown in the graph on the left side of FIG. 4, by the height xf [mm] from the optical axis. The graph on the right side of FIG. 4 shows the angles (emission angles β [deg]) of the charged particle trajectories at the exit of the electrostatic lens.

For deceleration ratios of 1/5, 1/10, and 1/20, high focusing is obtained over almost all incident angles, and the focusing angles are about ±7.1°, about ±9.0° and about ±12.7°, respectively.

On the other hand, when the deceleration ratio is 1/50 or 1/100, large spherical aberration occurs and the emission angle β is significantly increased. The emission angles β for the incident angle α=20° are about −10.2° and about −21.1°, respectively. When the emission angle β becomes larger, it often exceeds the allowable acceptance angle of a projection lens or an energy analyzer provided in the subsequent stage.

For example, the acceptance angle of concentric hemispherical analyzer (CHA), which is a general energy analyzer, is about ±6 to ±7°. Also, many other energy analyzers have a limit of acceptance angle of about ±7° or ±8°. If such an energy analyzer is placed after the variable deceleration ratio spherical aberration correction electrostatic lens of this Embodiment and the deceleration ratio of the electrostatic lens is set to about 1/10 or higher, the angle information will be lost. Therefore, when the variable deceleration ratio spherical aberration correction electrostatic lens is used in combination with such an energy analyzer, the potential is adjusted so that the focusing angle of the electrostatic lens becomes less than about ±7°.

Embodiment 2

Figure 5:
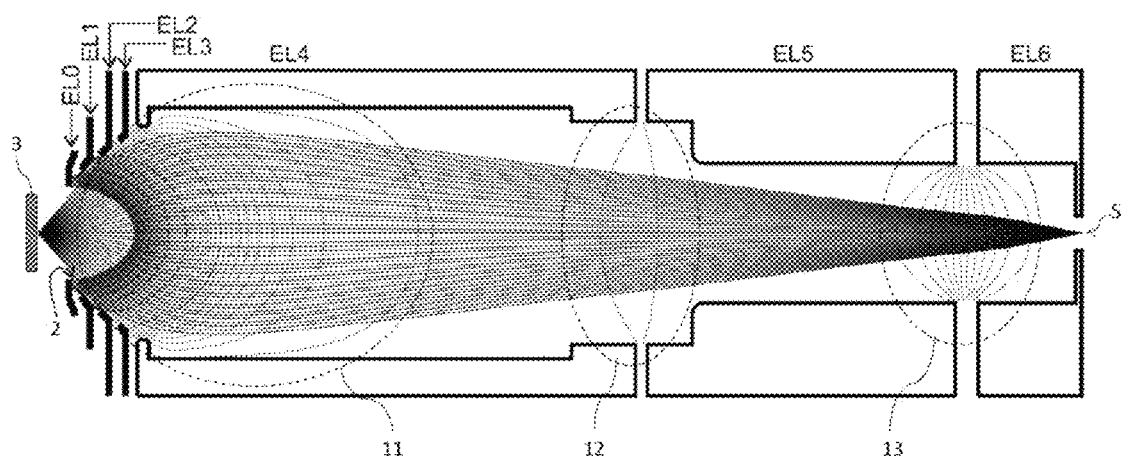
FIG. 5 shows a configuration explanatory view of a variable deceleration ratio spherical aberration correction electrostatic lens of Embodiment 2.

FIG. 5 shows the configuration of the variable deceleration ratio spherical aberration correction electrostatic lens of the Embodiment 2. The variable deceleration ratio spherical aberration correction electrostatic lens of the Embodiment 2 is composed of seven electrodes (EL0 to EL6), and has the feature that charged particles having a large divergence angle are decelerated and focused in three steps. In the first stage of the deceleration, the charged particles are decelerated by the deceleration electric field (first deceleration electric field 11) by the five electrodes (EL0 to EL4) on the sample 3 side (first stage deceleration). Here, the charged particles are decelerated to about 1/5 of the energy at the incidence. After that, the charged particles are decelerated to about 1/5 to 1/6 of the incident energy (second stage deceleration) by the deceleration electric field (second deceleration electric field 12) provided in the center of the electrostatic lens, and they are further decelerated (third stage deceleration) by the deceleration electric field (third deceleration electric field 13) provided on the exit side, and focused at the exit position 5 of the electrostatic lens.

Although the deceleration ratio was set to 1/10 in the above-mentioned Embodiment 1, the deceleration ratio is set to 1/20 in the Embodiment 2. By adjusting the first deceleration electric field 11 and the second deceleration electric field 12 together, it is possible to finely adjust the height and direction of the trajectories of the charged particles before the charged particles enter the third deceleration electric field 13. This makes it possible to reduce spherical aberration and reduce the focusing angle.

Figure 6:
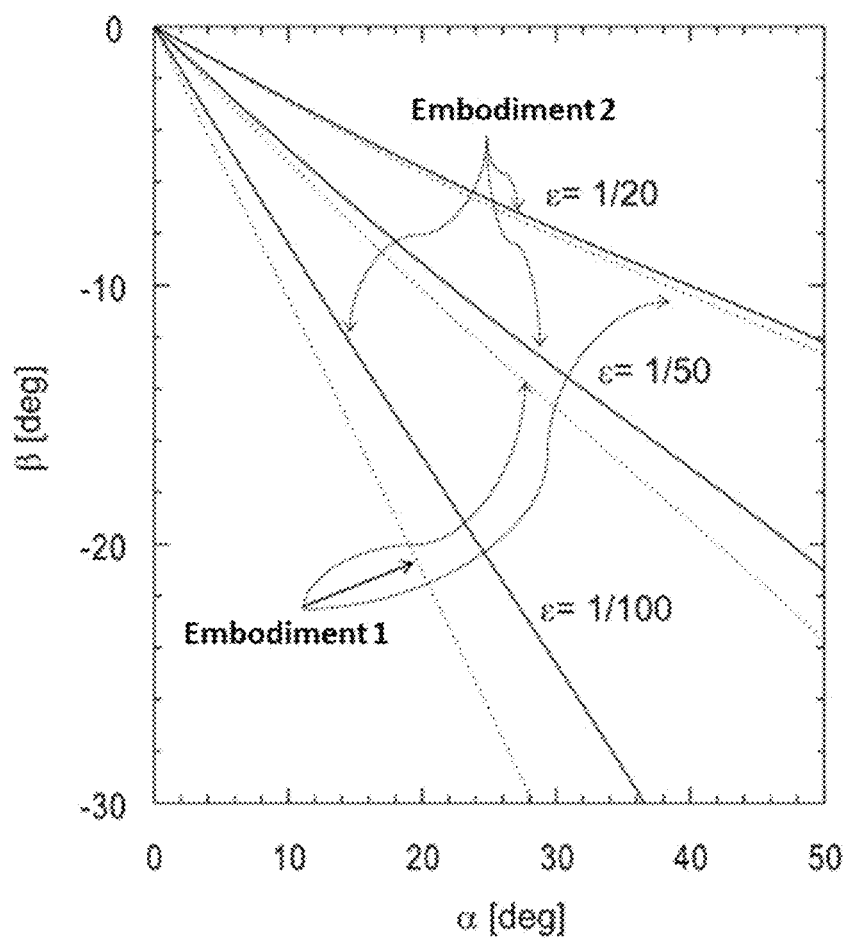
FIG. 6 shows an explanatory view of emission angles of a variable deceleration ratio spherical aberration correction electrostatic lens of Embodiment 2.

FIG. 6 shows the emission angles β obtained in the variable deceleration ratio spherical aberration correction electrostatic lens of the Embodiment 2 (three-step deceleration) in comparison with the case of the Embodiment 1 (two-step deceleration) described above. It can be seen that the emission angles β for an incident angle a when the deceleration ratios ε are 1/20, 1/50, and 1/100 in the case of the Embodiment 2 (three-step deceleration) are decreased by 4%, 12% and 23%, respectively as compared with case of the Embodiment 1 (two-step deceleration), where the solid line plot corresponds to the electrostatic lens of Embodiment 2 and dotted line plot corresponds to the electrostatic lens of Embodiment 1. As described above, it is possible to reduce the emission angles β by changing the variable deceleration ratio spherical aberration correction deceleration type lens from 2-step deceleration to 3-step deceleration.

Embodiment 3

As was described in the Embodiment 2, the emission angle can be reduced by changing the variable deceleration ratio spherical aberration correction electrostatic lens from the two-step deceleration to the three-step deceleration. However, in the variable deceleration ratio spherical aberration correction electrostatic lens of the Embodiment 2, if the deceleration ratio is set to 1/20 or larger, there is a problem that it becomes difficult to reduce the focusing angle to less than about ±10°. In this embodiment, a variable deceleration ratio spherical aberration correction electrostatic lens capable of further reducing the focusing angle will be described.

Figure 7:
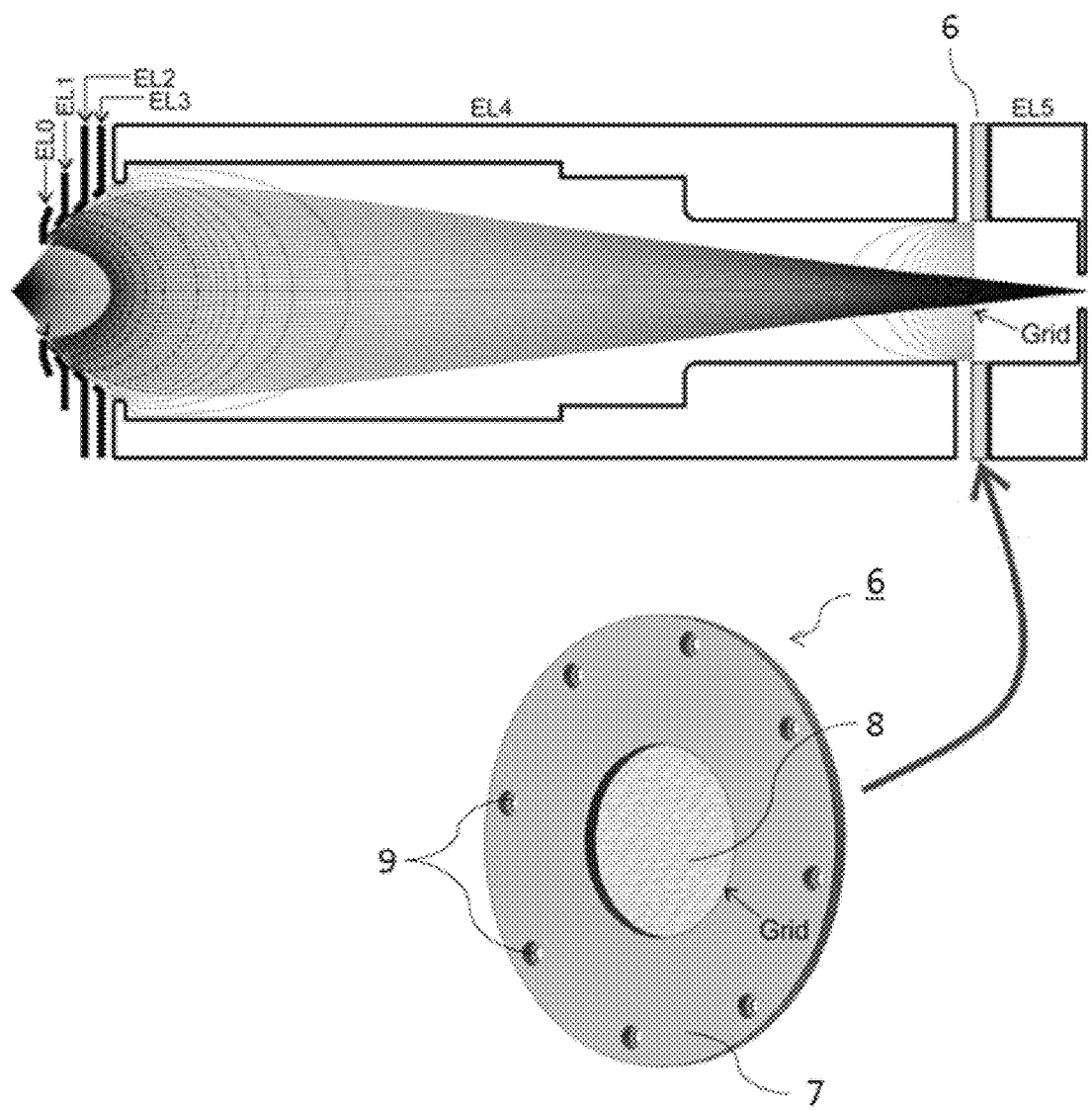
FIG. 7 shows a configuration explanatory view of a variable deceleration ratio spherical aberration correction electrostatic lens of Embodiment 3.

FIG. 7 shows a configuration of the variable deceleration ratio spherical aberration correction electrostatic lens of the Embodiment 3. The electrostatic lens shown in FIG. 7 is a modification of the variable deceleration ratio spherical aberration correction electrostatic lens (see FIG. 2) of the Embodiment 1 for the 5th electrode (EL5), with a planar grid 6 characteristically being provided onto the 5th electrode (EL5). The planar grid 6 may be integrated with the 5th electrode, or may be designed to be detachable. The electrostatic lens of the Embodiment 3 shown in FIG. 7 is designed so that the planar grid 6 is detachable. Specifically, the planar grid 6 is configured in such a way that the metal grid 8 is attached to the metal ring 7 by spot welding or other methods. The metal ring 7 and the fifth electrode (EL5) are fixed by screws (not shown). The metal ring 7 is provided with a screw hole 9 (a counterbore boring hole for embedding a drill hole and a screw head in a material so that they are flush with each other) for fixing to an electrode (EL5) with a screw.

The trajectories of charged particles when using the electrostatic lens of the Embodiment 3 as shown in FIG. 7 are those with the case where the deceleration ratio is set to 1/20. With regard to the focusing angle, the emission angle β in a case where a planar grid 6 is not used for the 5th electrode is about ±12° as shown in FIG. 6 above, however the emission angle β can be reduced to about ±7° by using the planar grid 6.

Figure 8:
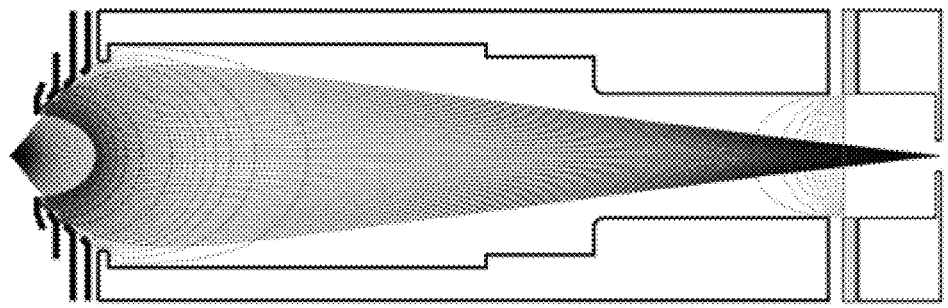
FIG. 8 shows an explanatory view of deceleration ratio of a variable deceleration ratio spherical aberration correction electrostatic lens of Embodiment 3.
Figure 8:
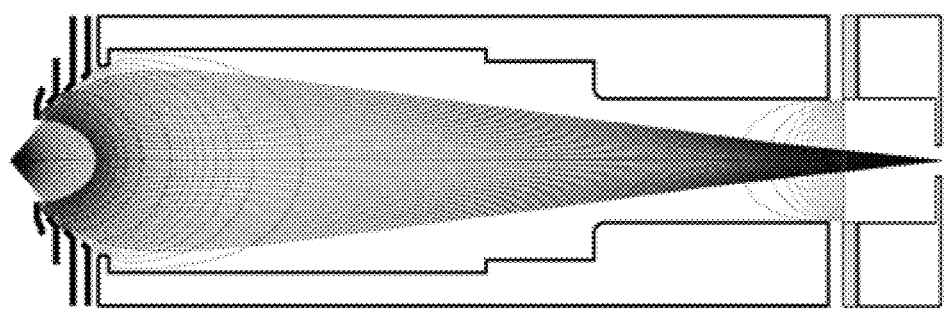
Figure 8:
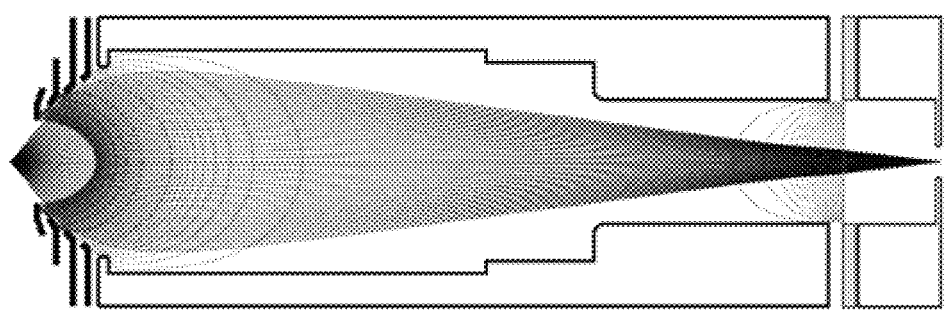
Figure 8:
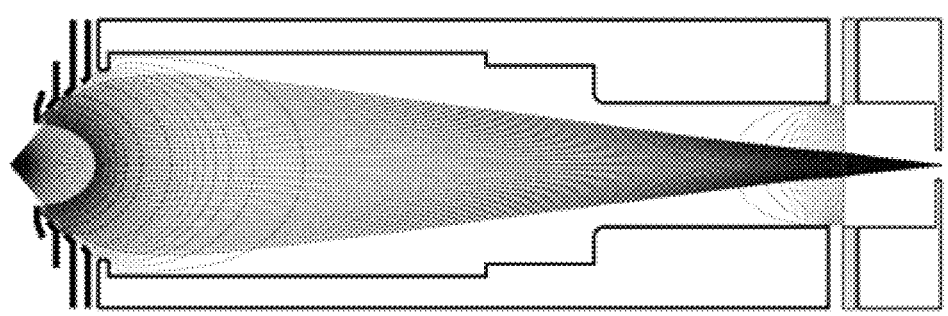
Figure 9:
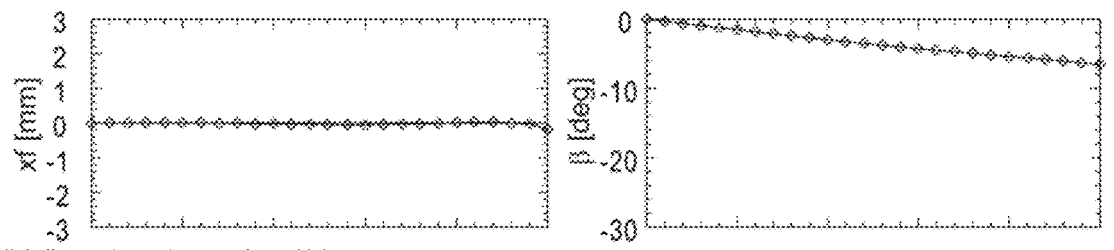
FIG. 9 shows an explanatory view of trajectories of charged particles at the exit of a variable deceleration ratio spherical aberration correction electrostatic lens of Embodiment 3.
Figure 9:
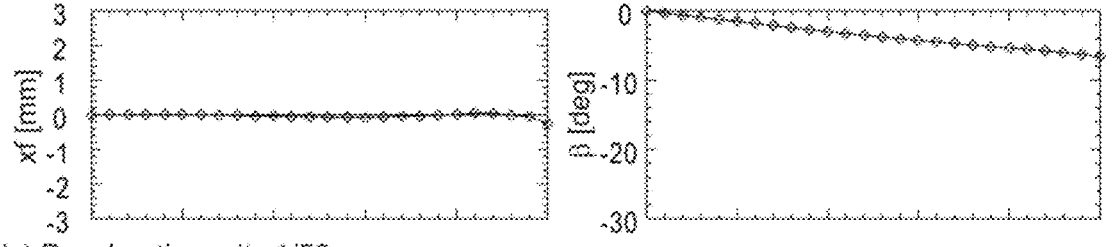
Figure 9:
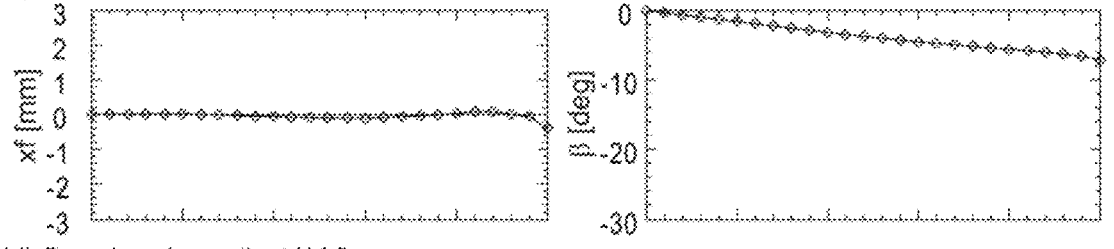
Figure 9:
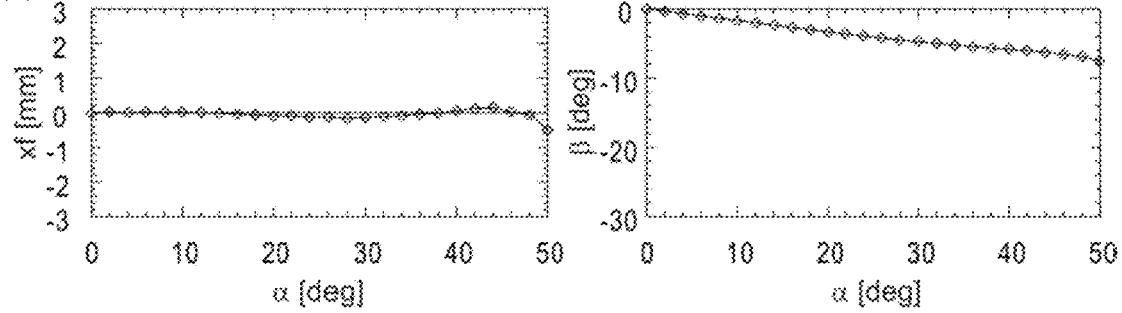

With reference to FIGS. 8 and 9, the deceleration ratio of the variable deceleration ratio spherical aberration correction electrostatic lens of the Embodiment 3 and the trajectories of charged particles at the exit of the electrostatic lens are described. FIG. 8 shows changes in the trajectories of charged particles when the deceleration ratio is changed to 1/10, 1/20, 1/50 and 1/100. FIG. 9 shows the spherical aberration and the focusing angle obtained by the lens setting of FIG. 8. The important point shown in FIG. 9 is that the focusing angle of the trajectories of charged particles is kept substantially constant (about ±7°) regardless of the deceleration ratio. In addition, it is a feature of the variable deceleration ratio spherical aberration correction electrostatic lens of this embodiment that the focusing is also significantly improved by a plane grid 6.

Embodiment 4

Figure 10:
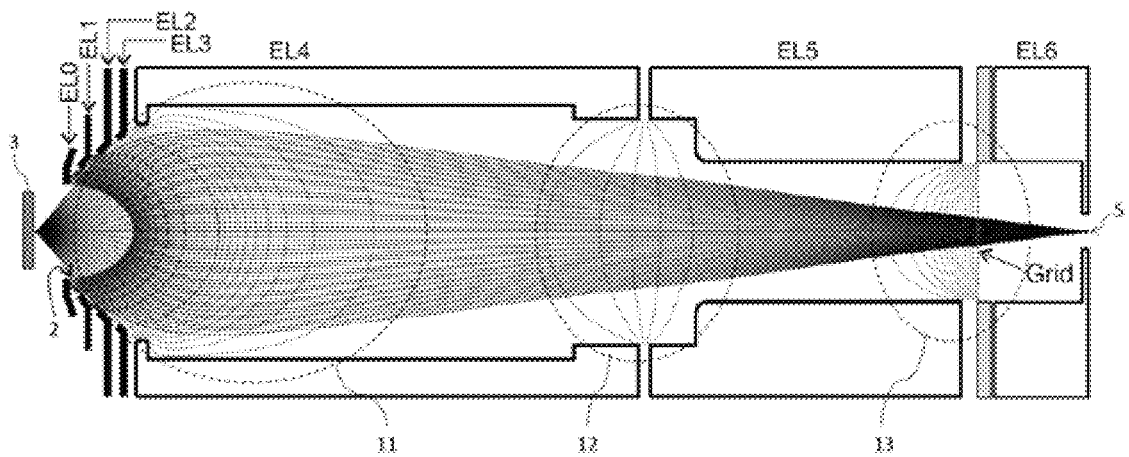
FIG. 10 shows a configuration explanatory view of a variable deceleration ratio spherical aberration correction electrostatic lens of Embodiment 4.
Figure 11:
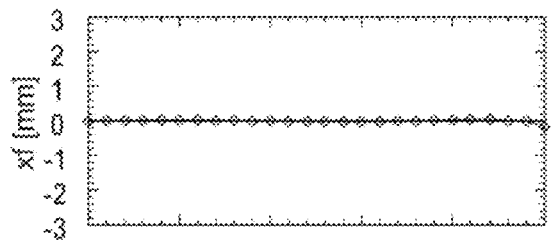
FIG. 11 shows an explanatory view of trajectories of charged particles at the exit of a variable deceleration ratio spherical aberration correction electrostatic lens of Embodiment 4.
Figure 11:
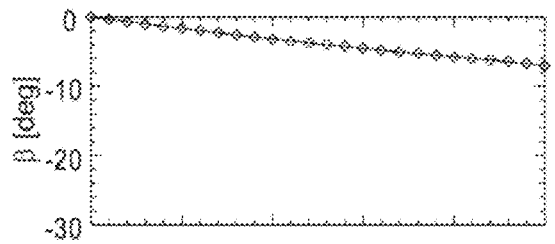
Figure 11:
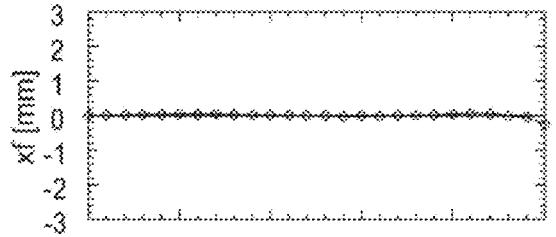
Figure 11:
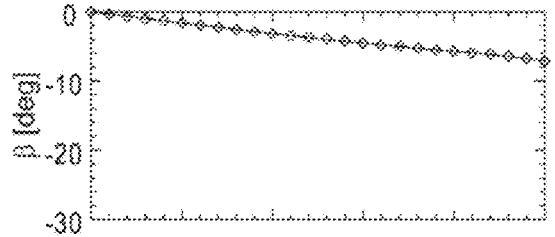
Figure 11:
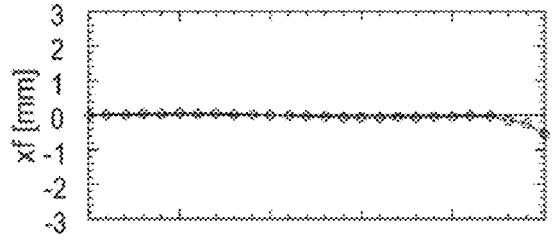
Figure 11:
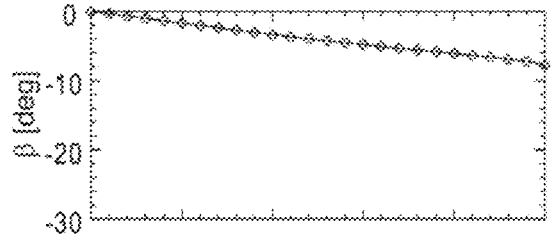
Figure 11:
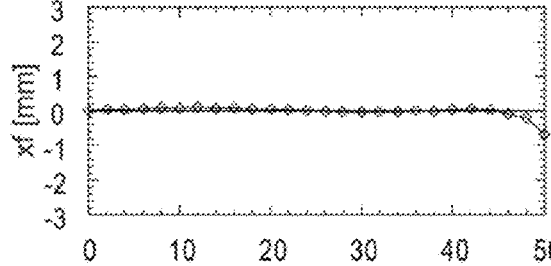
Figure 11:
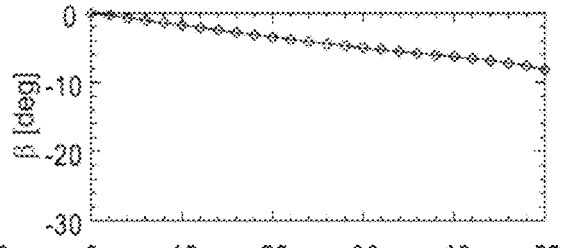

FIG. 10 shows the configuration of the variable deceleration ratio spherical aberration correction electrostatic lens of the Embodiment 4. FIG. 10 is the case where a planar grid 6 shown in the Embodiment 3 is provided for the three-stage variable deceleration ratio spherical aberration correction electrostatic lens of the Embodiment 2. The planar grid 6 is provided on the sixth electrode (EL6). Further, FIG. 11 shows the spherical aberration and the focusing angles obtained when the deceleration ratio is changed to 1/10, 1/20, 1/50 and 1/100. Comparing them with the results of the two-step deceleration of the Embodiment 3 (graphs shown in FIG. 9), it can be seen that the spherical aberration is reduced and the focusing is improved especially when the deceleration ratio is 1/50 and 1/100.

Embodiment 5

Figure 12:
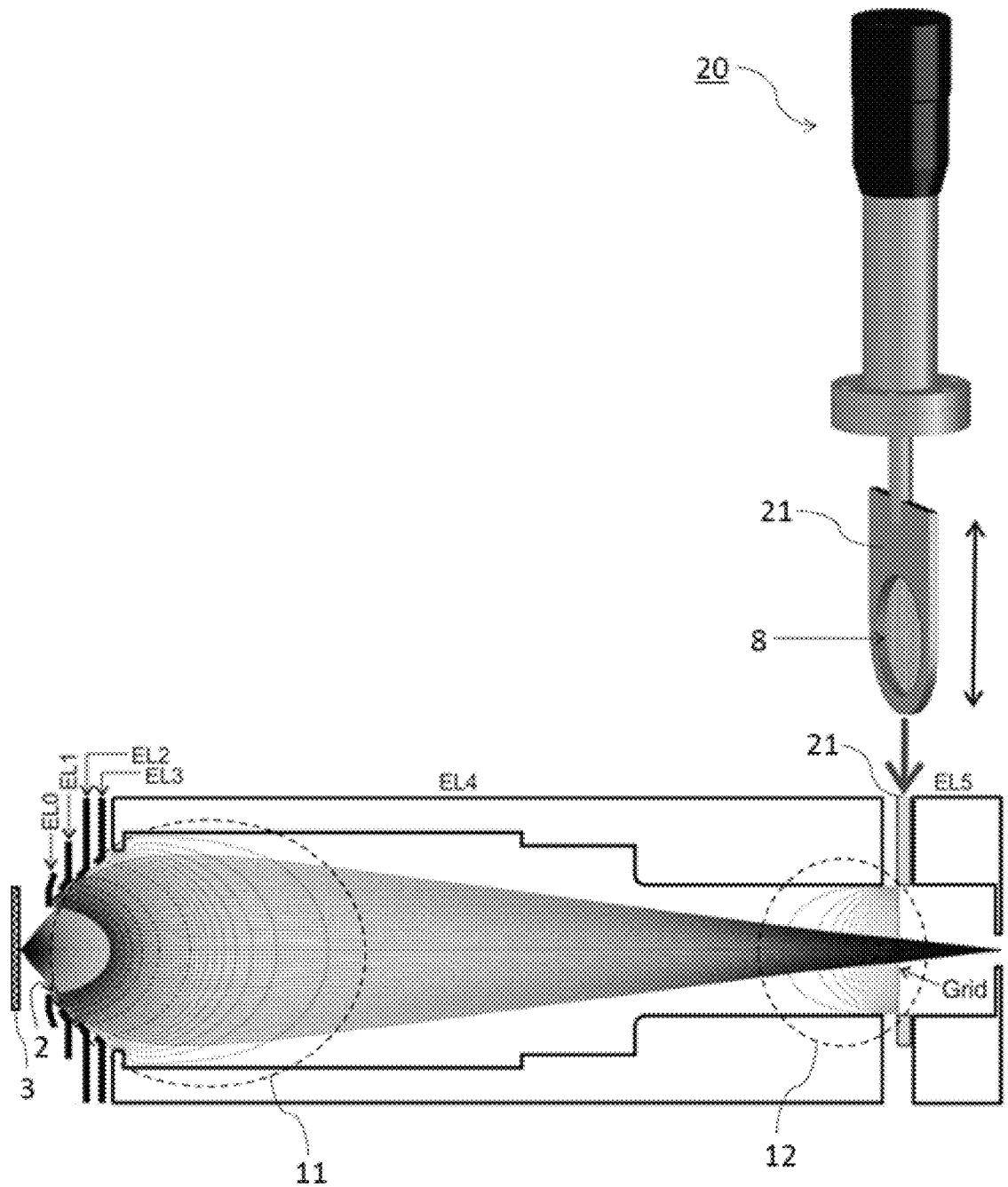
FIG. 12 shows a configuration explanatory view of a variable deceleration ratio spherical aberration correction electrostatic lens of Embodiment 5.

FIG. 12 shows the configuration of the variable deceleration ratio spherical aberration correction electrostatic lens of the Embodiment 5. While the planar grid 6 is screwed to a specific electrode via a metal ring in the electrostatic lens configuration of the Embodiment 3 (see FIG. 7) and the Embodiment 4 (see FIG. 10), it is also possible to insert a planar grid from the outside, as is seen in the electrostatic lens of the Embodiment here.

That is, as in the planar grid 20 shown in FIG. 12, the opening plate 21 provided with the metal grid 8 can be inserted so as to be orthogonal to the optical axis, attached to the tip of the mechanism to be introduced linearly. Alternatively, although not shown in Figure, it is also possible to insert the opening plate 21 provided with the metal grid 8 so as to be orthogonal to the optical axis by using a rotation mechanism. If such a mechanism is provided, measurement can be performed with flexible settings such as using or not using a planar grid, depending on the situation.

A disadvantage of using a planar grid is a decrease in analyzer sensitivity due to the aperture ratio of the planar grid. When charged particles pass through the planar grid, each hole in the planar grid acts as a tiny electrostatic lens, causing the trajectories to be slightly bent. Due to this effect, the angle pattern and the magnified image may be blurred. In order to reduce this minute lens action to a negligible level, it is necessary to make the mesh size of the planar grid about 10 µm or less.

When the opening of the planar grid can be about 100 µm or more, a commercially available metal planar grid with an aperture ratio of 60% or more can be used, but when the opening is made to be about 10 µm or less, it is not easy to achieve such a high aperture ratio, which results in low sensitivity. Therefore, for example, in the measurement of the kinetic energy of a charged particle, if the peak position of the target signal is sufficiently far from the peak position of another signal and does not require very high energy resolution, an option to perform a measurement at a lower deceleration ratio while the planar grid is retracted becomes effective. Also, in an experiment to measure a two-dimensional emission angle distribution by acquiring a signal of low intensity, in order to avoid wasting time, it is desirable to firstly confirm the peak position of the signal with the setting that makes the sensitivity as high as possible, and after that, it is desirable to perform measurement by switching to a setting that allows simultaneous measurement of the two-dimensional angular distribution over a wide acceptance solid angle with high energy resolution.

A variable deceleration ratio spherical aberration correction electrostatic lens provided with a planar grid that can be inserted and removed as in the configuration of the electrostatic lens of this Embodiment can be effectively used in such a measurement.

Embodiment 6

Figure 13:
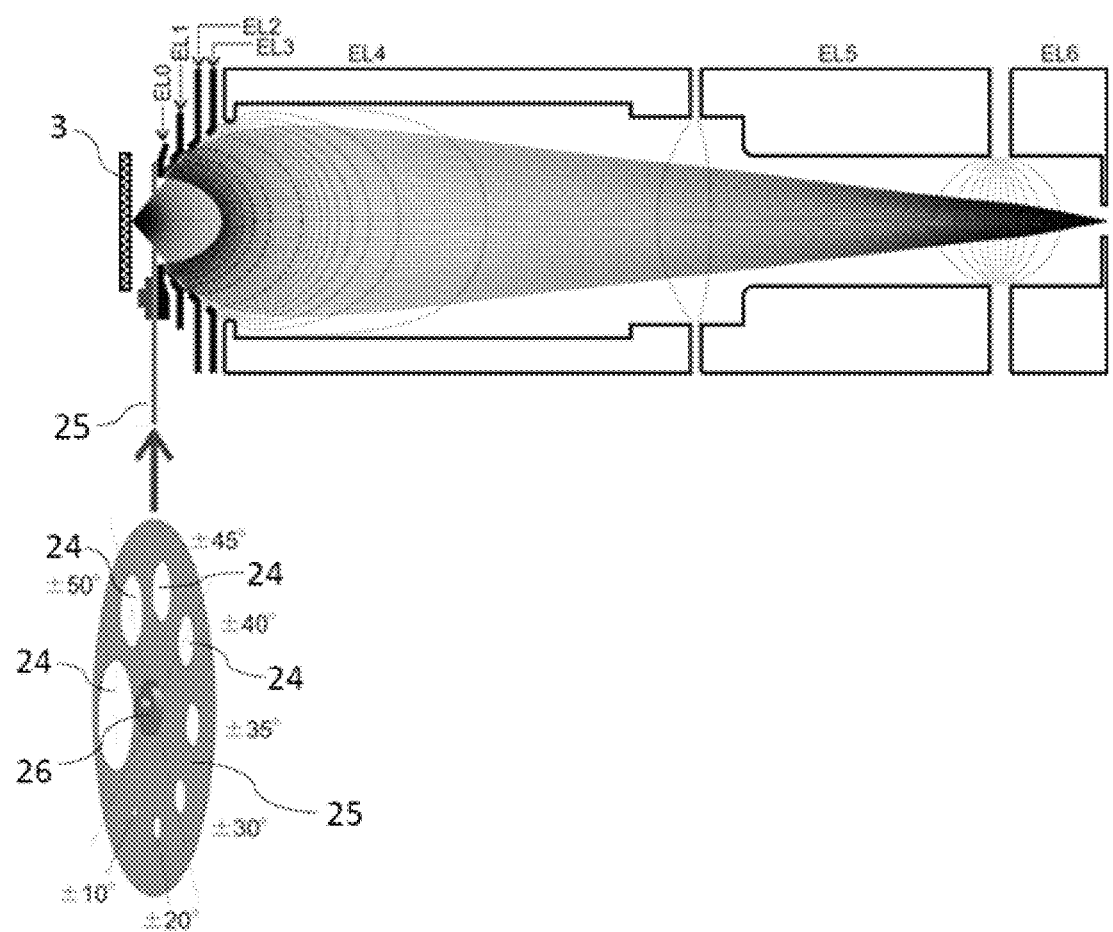
FIG. 13 shows a configuration explanatory view of a variable deceleration ratio spherical aberration correction electrostatic lens of Embodiment 6.

FIG. 13 shows the configuration of the variable deceleration ratio spherical aberration correction electrostatic lens of the Embodiment 6. As shown in FIG. 13, in the variable deceleration ratio spherical aberration correction electrostatic lens of this Embodiment, an opening that limits emission angles of charged particles coming from the point source on the sample 3 is provided at the entrance of the electrostatic lens. In the electrostatic lens of this Embodiment, a rotating plate 25 provided with a plurality of openings 24 having different aperture areas and a rotating mechanism (a mechanism for rotating the rotating shaft 26 of the rotating plate) (not shown) are used. The rotating plate 25 is provided with circular openings 24 having different radii around some points on the circumference distant from the center of rotation by a predetermined distance.

In the configuration shown in FIG. 13, eight openings 24 are provided in the circular plate, where the maximum opening has the same size as that of the entrance of the lens, and the other openings have an acceptance angle of (from larger ones) ±50°, ±45°, ±40°, ±35°, ±30°, ±20°, ±10°. The shape and size of the rotating plate 25, the number of holes to be provided and the like depend on the design, and various changes are possible. The rotating plate 25 and the rotating mechanism are attached to the 0th electrode (EL0), an insulating member, a cover member of an electrostatic lens, or the like.

The mounting position of the rotating plate 25 and the rotating mechanism is determined so that the distance of the rotating plate 25 from the center axis of the electrostatic lens and the radius of the circumference passing through the center of each opening coincide. As a result, by rotating the rotating plate 25, an arbitrary aperture is moved to the center position of the electrostatic lens entrance.

The charged particles collected by the variable deceleration ratio spherical aberration correction electrostatic lens of this Embodiment are focused by this electrostatic lens, and then directly or through an electron optical system provided in a subsequent stage, are processed by the detector such as an MCP (microchannel plate). When the detector is a two-dimensional detector such as an MCP screen, the two-dimensional emission angle distribution and a magnified image of the sample are projected on the screen. By using the configuration of the electrostatic lens of this Embodiment and limiting the angle, it is possible to improve the spatial resolution of the magnified image. In addition, when measuring the two-dimensional emission angle distribution by providing a projection lens or energy analyzer after the electrostatic lens of this Embodiment, data with higher signal to noise ratio (SN ratio) can be obtained when acceptance angle is limited depending on the deceleration ratio and the performance of the electro-optical system.

Embodiment 7

Figure 14:
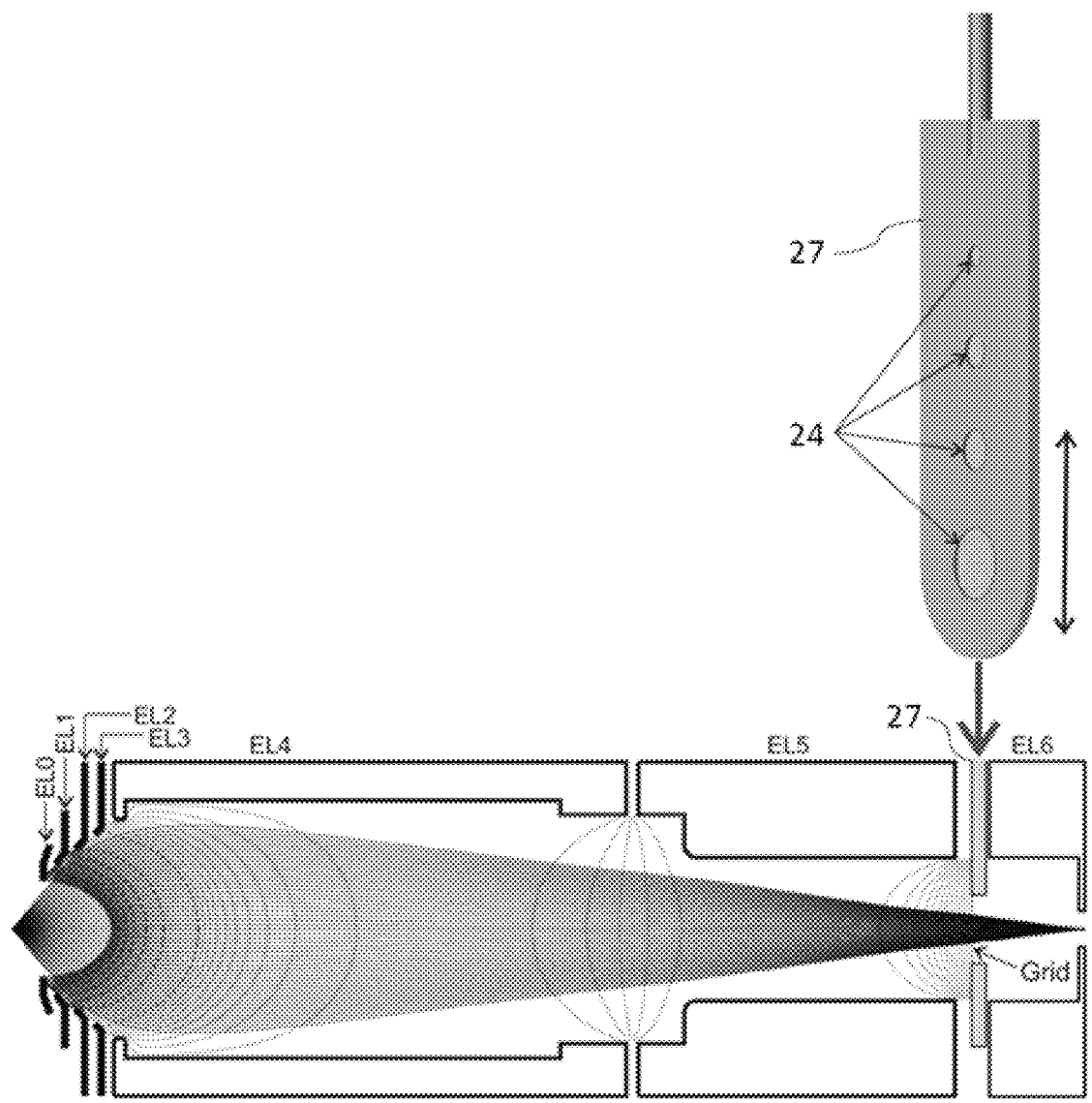
FIG. 14 shows a configuration explanatory view of a variable deceleration ratio spherical aberration correction electrostatic lens of Embodiment 7.

FIG. 14 shows the configuration of the variable deceleration ratio spherical aberration correction electrostatic lens of the Embodiment 7. The electrostatic lens of this Embodiment shown in FIG. 14 includes an aperture plate 27 with a planar grid that limits the angle. In the electrostatic lens of this Embodiment, an aperture plate 27 in which four apertures 24 with planar grids having different radii are arranged in a row is placed in front of the sixth electrode (EL6). Each of the apertures 24 with a planar grid can be moved to the central axis of the electrostatic lens by sliding the aperture plate 27. The largest aperture is sized to pass through the charged particle trajectories at all angles of incidence, and the other openings are sized to limit the angle spread of the charged particle trajectories. The arrangement and size of the opening plate 27 are not limited to those shown in FIG. 14, and various design changes are possible.

For example, it is also possible to use a circular opening plate in which openings with planar grids are arranged on a circumference. In this case, each aperture is moved to the central axis of the electrostatic lens by a rotation mechanism. Further, the opening plate may be provided with an opening without a planar grid in addition to the openings with planar grids. By switching and using various openings according to the purpose and situation, efficient and high-quality analysis becomes possible in the measurement of the energy distribution and the two-dimensional emission angle distribution of charged particles, the observation of magnified images, and the like.

Embodiment 8

Figure 15:
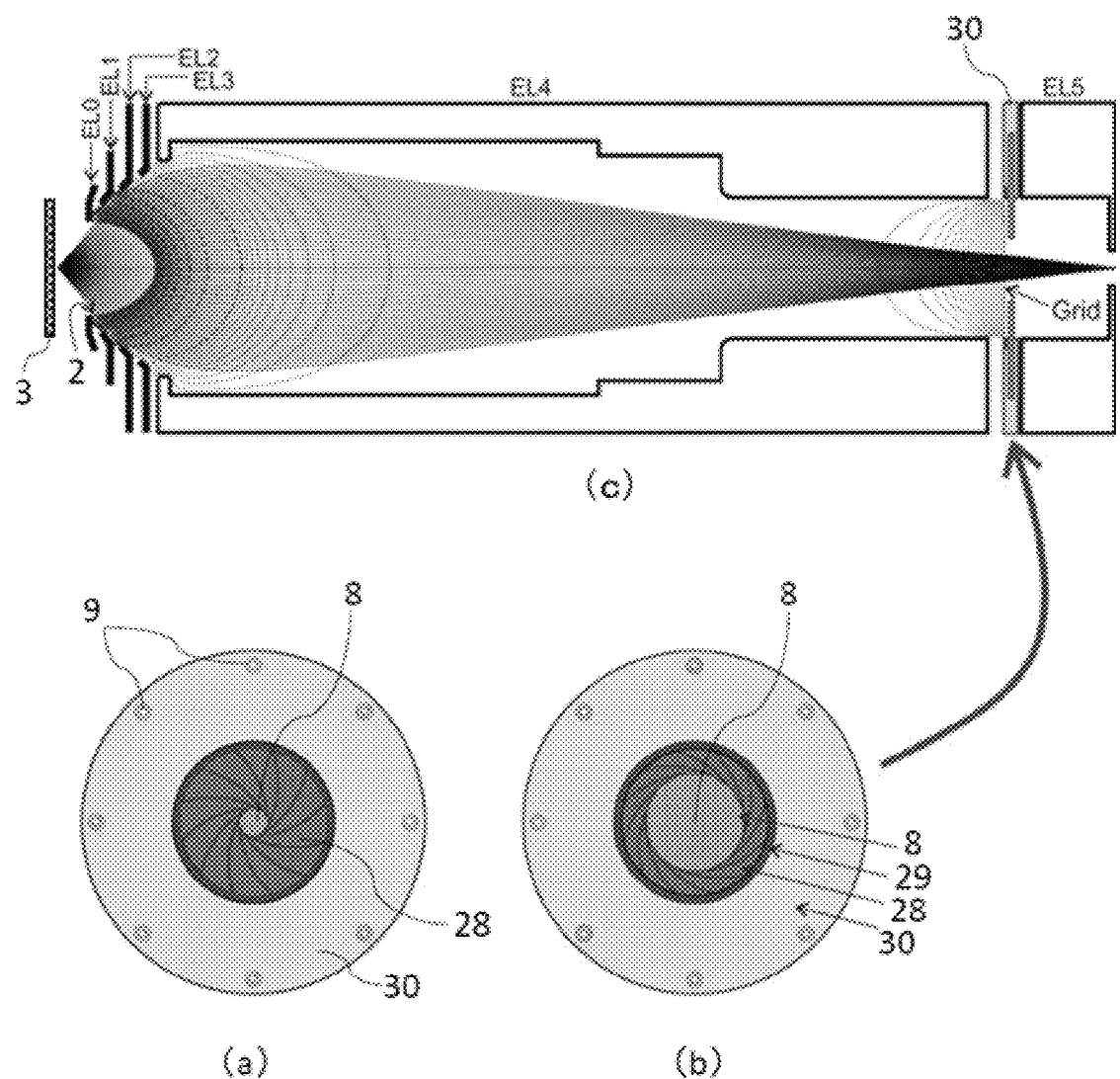
FIG. 15 shows a configuration explanatory view of a variable deceleration ratio spherical aberration correction electrostatic lens of Embodiment 8.

FIG. 15 shows the configuration of the variable deceleration ratio spherical aberration correction electrostatic lens of the Embodiment 8. The electrostatic lens of this embodiment shown in FIG. 15 includes an aperture plate 30 having variable aperture diaphragm 28 with a grid. In the opening plate 30, the metal grid 8 is fixed to the ring-shaped frame 29 for variable aperture stop. Also, the variable aperture diaphragm 28 moves in front of or behind the metal grid 8. Note that the variable aperture diaphragm 28 uses the similar technique as the diaphragm of the camera. FIG. 15(b) shows a setting wherein charged particle beams of all the incident angles are passed in a state where an opening is expanded. Whereas, FIG. 15(a) shows a setting which limits the angular expansion of charged particle beams in a state wherein opening is narrowed. The variable aperture diaphragm 28 with a grid is characterized in that the aperture size can be continuously changed, unlike the aperture plate 27 as shown in the Embodiment 7 (see FIG. 14) described above. That is to say that the optimum opening size can be selected according to the purpose and situation.

Embodiment 9

Figure 16:
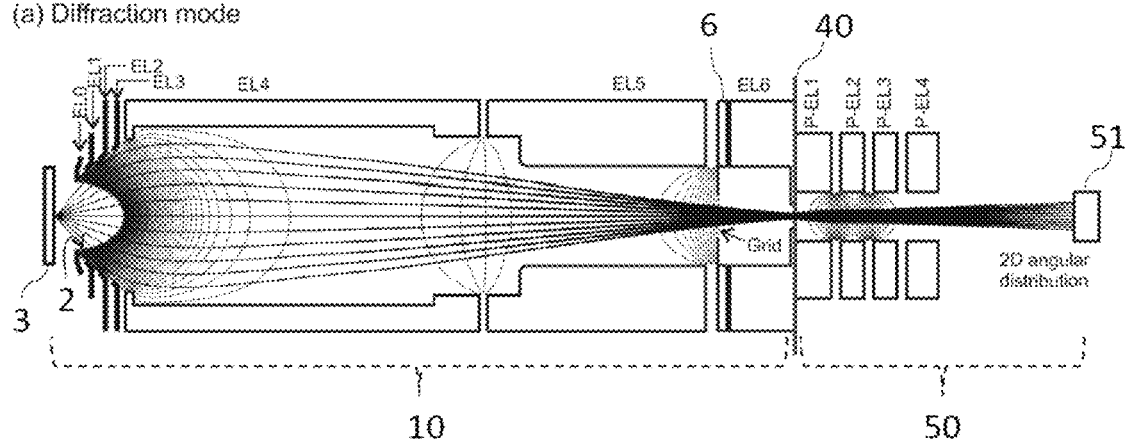
FIG. 16 shows a configuration explanatory view of a two-dimensional electron spectrometer of Embodiment 9.

FIG. 16 shows one configuration of an Embodiment of a two-dimensional electron spectrometer. The two-dimensional electron spectrometer shown in FIG. 16 is composed of a variable deceleration ratio spherical aberration correction electrostatic lens 10 for three-step deceleration according to the Embodiment 4 and a projection lens 50. The projection lens 50 for projecting an image onto the screen 51 is provided via an aperture 40. Switching between the two-dimensional emission angle distribution and the magnified image is performed by changing the voltage applied to the projection lens 50. A conventional electrostatic lens can be used as the projection lens 50.

Figure 17:
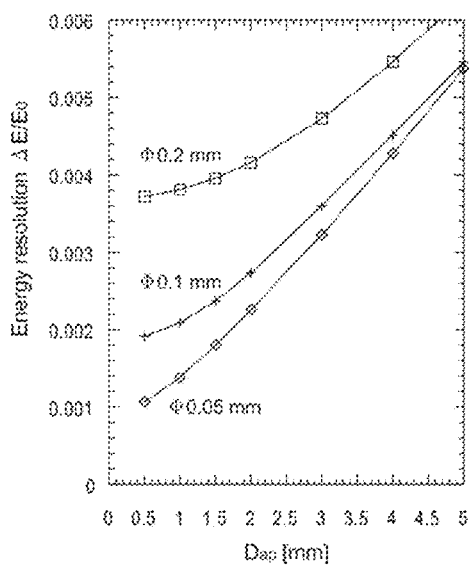
FIG. 17 shows an explanatory view of energy resolutions of a two-dimensional electron spectrometer of Embodiment 9.
Figure 17:
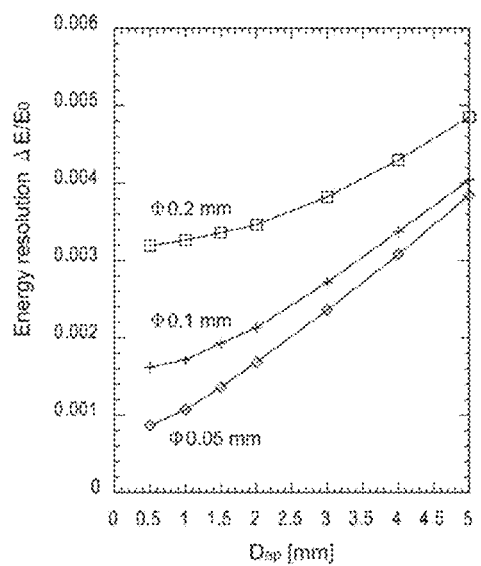

In the example of the two-dimensional electron spectrometer shown in FIG. 16, a projection lens 50 composed of four cylindrical electrodes (P-EL1 to P-EL4) is used. The energy analysis is performed by inserting the aperture 40 at the focusing position of the variable deceleration ratio spherical aberration correction deceleration type lens. FIG. 17 shows the simulation result of energy resolution of the two-dimensional electron spectrometer of this embodiment based on the electron trajectory calculation. The simulation was performed under a condition that the beam was irradiated on the sample confronting the electrostatic lens entrance at an angle of 15° measured from the sample surface. FIGS. 17(a) and 17(b) are the results when the deceleration ratios are 1/5 and 1/50, respectively. The energy resolution largely depends on the size of the spot of the beam irradiated to the sample 3, and the smaller the spot size, the higher the energy resolution can be obtained. The spot of the beam is determined by the diameter of the beam and the direction of incidence of the beam. Regarding the incident direction of the beam, the closer the incident direction is near the vertical surface, the smaller the spot size becomes and high energy resolution is possible, however, it is necessary to set the angle between the beam and the central axis of the lens to be at 70° to 75° or more for securing a beam trajectory that does not interfere with lens member at a wide angle lens having an acceptance angle of ±50°. Therefore, the angle between the beam and the sample plane is set to 15°.

The graph of energy resolution shown in FIG. 17 shows the simulation results when the beam diameters φ are 0.2 mm, 0.1 mm, and 0.05 mm. The beam diameter φ is in the range that can be actually used in an electron gun or synchrotron radiation. According to FIG. 17(a), when the deceleration ratio is set to 1/5, the energy resolution ($\Delta E/E_0$) is obtained to be $3.8 \times 10^{-3}$, $2.1 \times 10^{-3}$, and $1.3 \times 10^{-3}$, respectively, when the beam diameters φ are 0.2 mm, 0.1 mm, and 0.05 mm with respect to the setting of the aperture diameter of 1 mm. Further, according to FIG. 17(b), when the deceleration ratio is set to 1/50, the energy resolutions ($\Delta E/E_0$) are seen to be improved up to $3.2 \times 10^{-3}$, $1.7 \times 10^{-3}$ and $1.0 \times 10^{-3}$.

Figure 30:
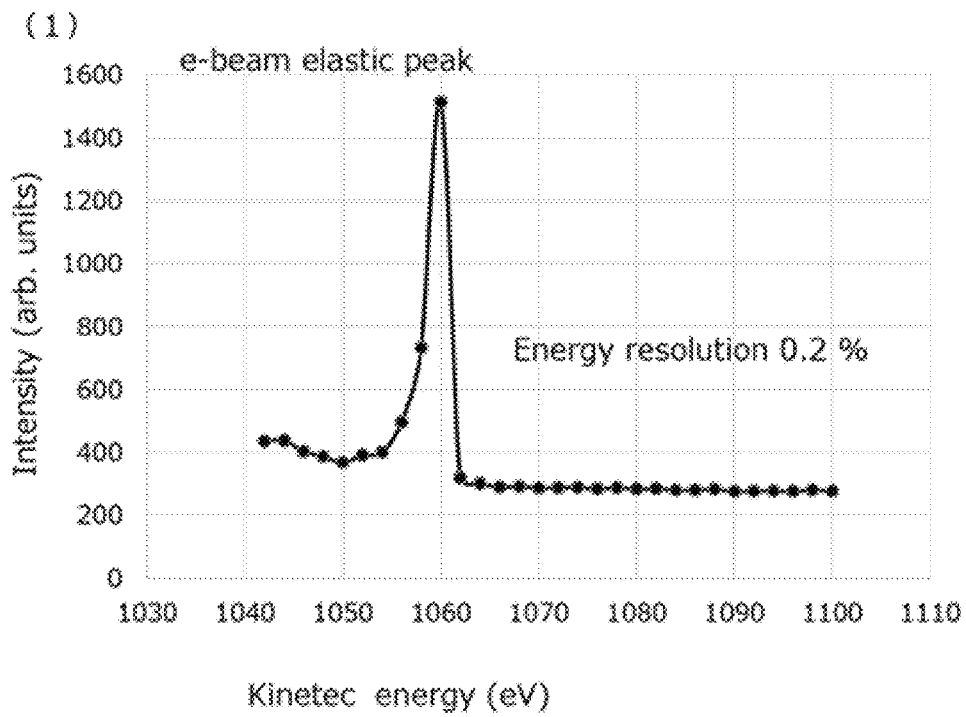
FIG. 30 shows a view of measurement results of energy resolution of a two-dimensional electron spectrometer of Embodiment 9.
Figure 30:
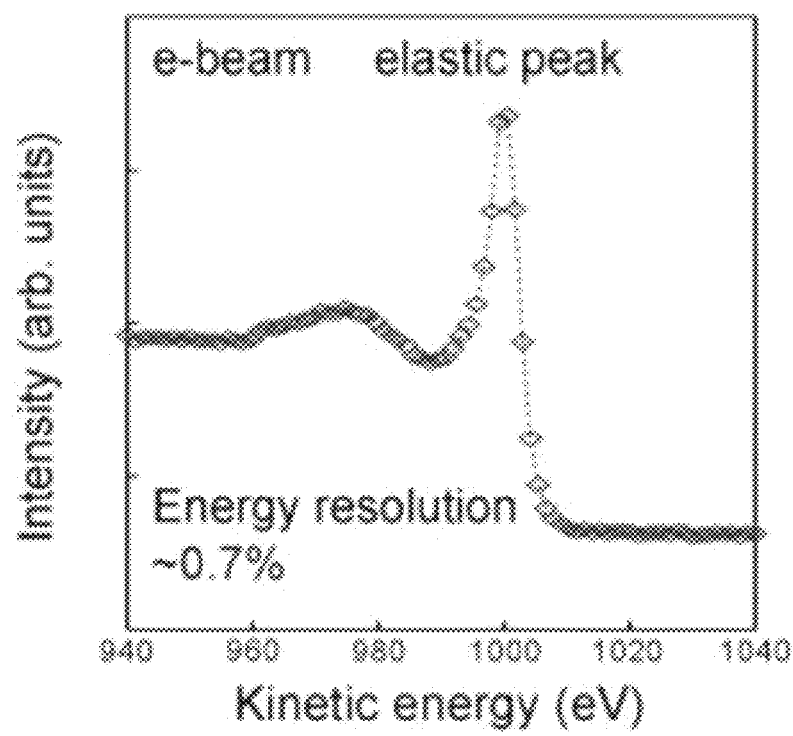

The actual measurement result is shown in FIG. 30(1). FIG. 30(1) shows the measurement result of the energy distribution of the reflected electrons by irradiating the sample with an electron beam (e-beam) having an energy of 1060 (eV). As shown in the figure, the elastic peak is observed at 1060 (eV), and it is understood that the half width of the elastic scattering peak is about 2 (eV), and the energy resolution is obtained to be 2/1060=0.002. This corresponds to the energy resolution prediction (simulation result) shown in FIG. 17, which indicates that at Dap=1, even if the beam diameter φ applied to the sample changes a little, it is approximately 0.002 (0.2%), showing that the prediction of the energy resolution shown in FIG. 17 is almost correct.

In the two-dimensional electron spectrometer (refer to Non-patent literature 1) using the spherical aberration correction electrostatic lens of the prior art, in the simulation result in which the incident angle and the aperture diameter are set under the same conditions as above, the energy resolution is $7.1 \times 10^{-3}$ and $5.0 \times 10^{-3}$, respectively with beam diameters φ being 0.2 mm and 0.1mm. As shown in FIG. 30(2), in the measurement result for the energy distribution of reflected electrons obtained when an electron beam with an energy of 1000 (eV) is applied to the sample, the energy resolution estimated by the full width at half maximum of the elastic scattering peak is 0.7%.

As described above, it can be seen that by using the variable deceleration ratio spherical aberration correction electrostatic lens of the present invention in the two-dimensional electron spectroscope, the energy resolution is improved by several times as compared with the two-dimensional electron spectrometer using the conventional spherical aberration correction electrostatic lens.

Embodiment 10

Figure 18:
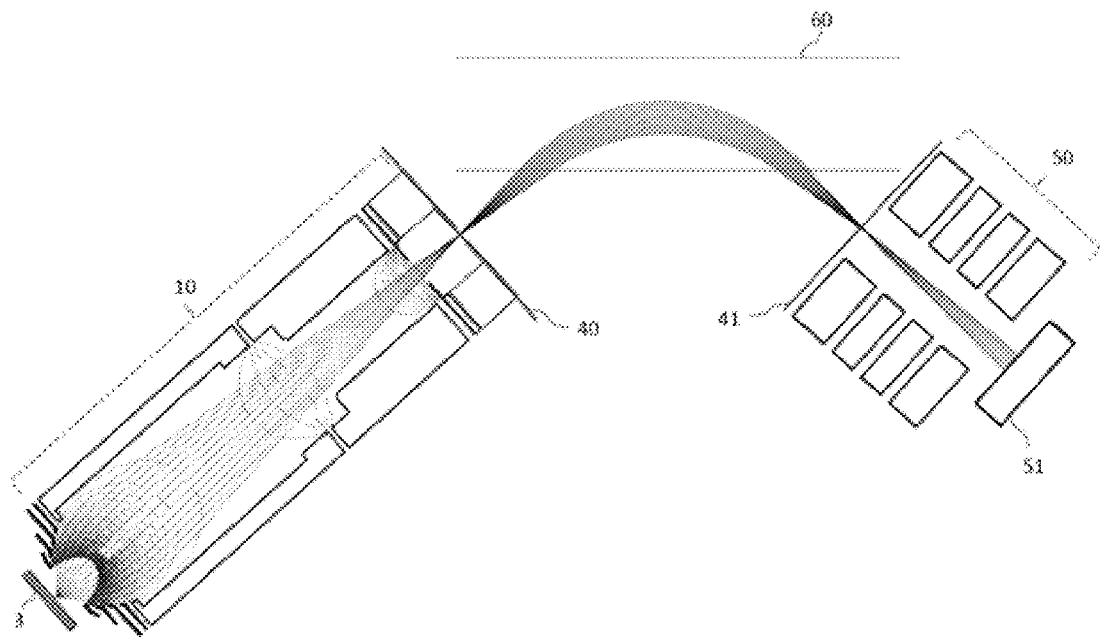
FIG. 18 shows a configuration explanatory view of a two-dimensional electron spectrometer of Embodiment 10.

FIG. 18 shows the configuration of another Embodiment of the two-dimensional electron spectrometer. The two-dimensional electron spectrometer shown in FIG. 18 includes a variable deceleration ratio spherical aberration correction electrostatic lens 10 for three-step deceleration according to the Embodiment 4, a conventionally known cylindrical mirror type energy analyzer (CMA) 60, a projection lens 50, and a screen 51. A CMA 60 is provided at the rear stage of the electrostatic lens 10 via an aperture 40. A projection lens 50 for projecting a two-dimensional emission angle distribution and a magnified image of the sample on the screen 51 is provided after the CMA 60 via an aperture 41. Switching between the two-dimensional emission angle distribution and the magnified image is performed by changing the voltage applied to the projection lens. A conventional electronic lens can be used as the projection lens 50.

In this Embodiment, the 3-step deceleration variable deceleration ratio spherical aberration correction electrostatic lens 10 of the Embodiment 4 is used, but the 2-step deceleration variable deceleration ratio spherical aberration correction electrostatic lens of the Embodiment 1 and the variable deceleration ratio spherical aberration correction electrostatic lenses of other Embodiments 2, 3, 5 to 8 may be used.

Embodiment 11

Figure 19:
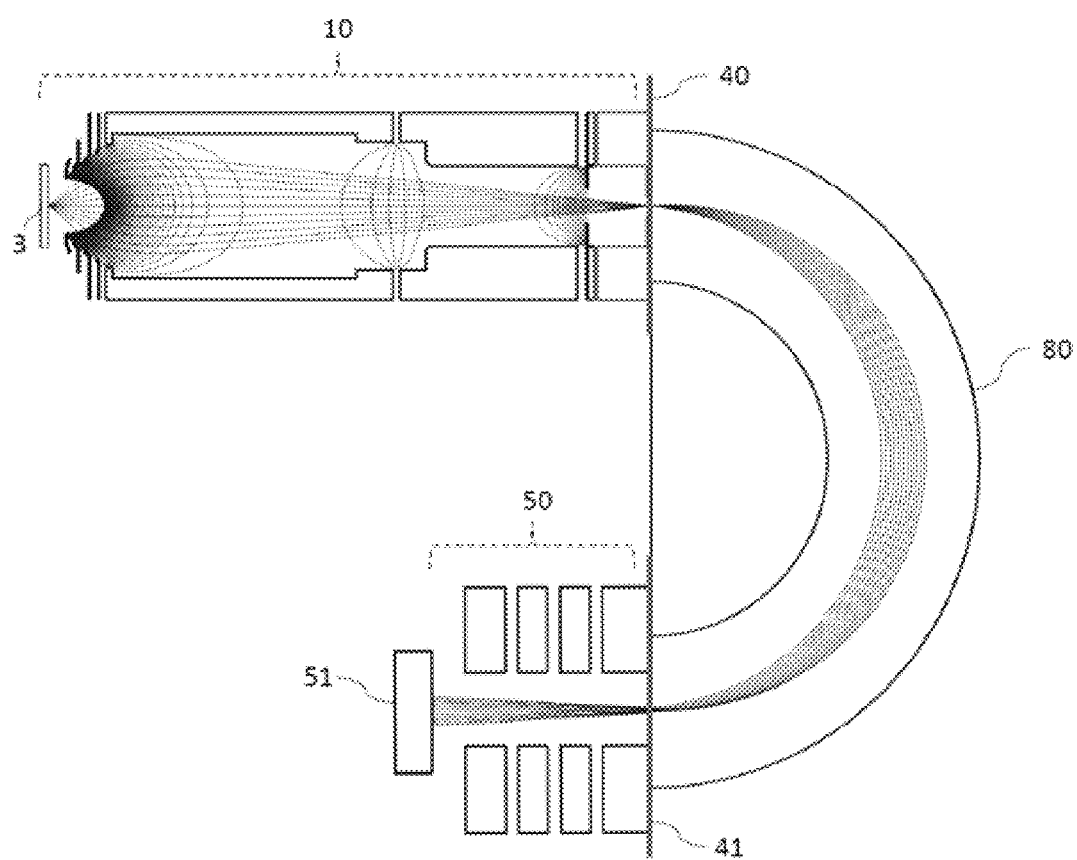
FIG. 19 shows a configuration explanatory view of a two-dimensional electron spectrometer of Embodiment 11.

FIG. 19 shows the configuration of another Embodiment of the two-dimensional electron spectrometer. The two-dimensional electron spectrometer shown in FIG. 19 includes a variable deceleration ratio spherical aberration correction electrostatic lens 10 for three-step deceleration according to the Embodiment 4, the concentric hemispherical analyzer (CHA) 80 described above, a projection lens 50, and a screen 51. And the CHA 80 is provided at the rear stage of the electrostatic lens 10 via an aperture 40. A projection lens 50 for projecting a two-dimensional emission angle distribution and a magnified image of the sample on the screen 51 is provided after the CHA 80 via the aperture 41. Switching between the two-dimensional emission angle distribution and the magnified image is performed by changing the voltage applied to the projection lens. A conventional electronic lens can be used as the projection lens 50.

Here, the CHA 80 may have only an electrostatic hemispherical part composed of two hemispheres having different radii, or may have a configuration including an input lens.

In this Embodiment, the 3-step deceleration variable deceleration ratio spherical aberration correction electrostatic lens 10 of the Embodiment 4 is used, but the 2-step deceleration variable deceleration ratio spherical aberration correction electrostatic lens of the Embodiment 1 and the variable deceleration ratio spherical aberration correction electrostatic lenses of other Embodiments 2, 3, 5 to 8 may be used. [Embodiment 12]

Figure 28:
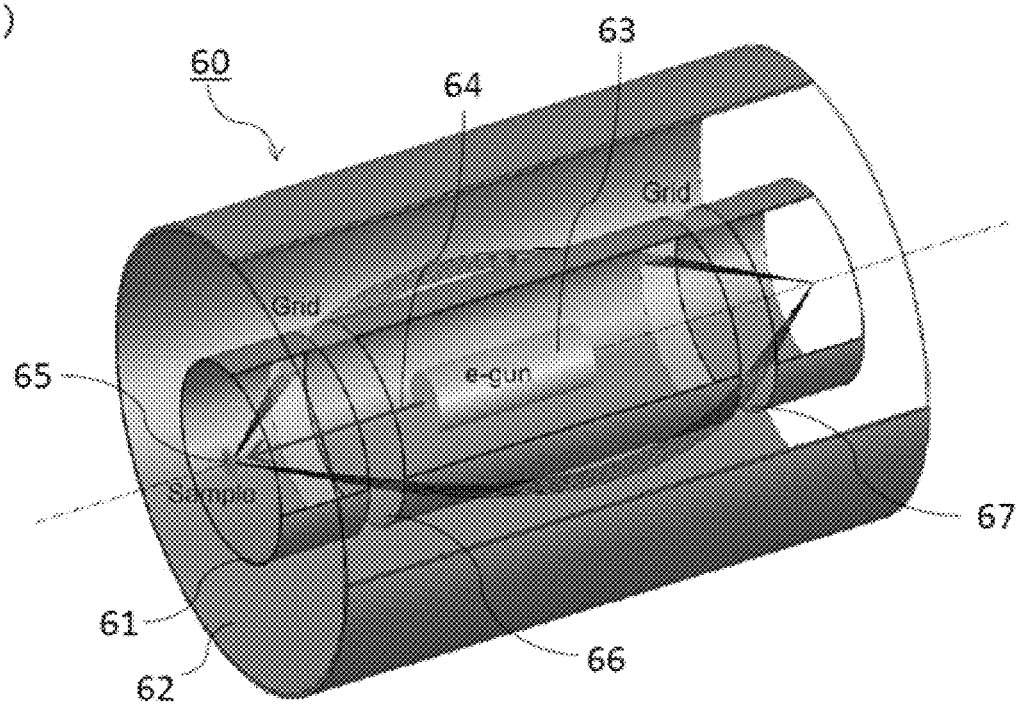
FIG. 28 shows a configuration explanatory view of a conventional cylindrical mirror type energy analyzer.
Figure 28:
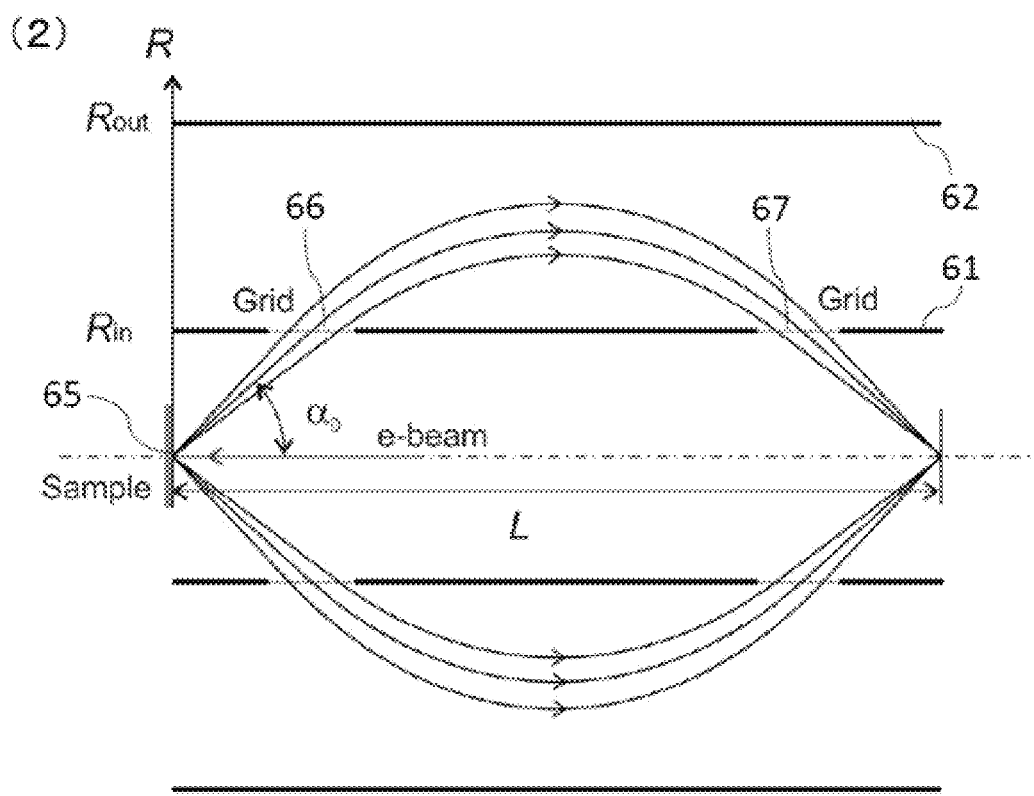

In this Embodiment, an Embodiment of the wide angle energy analyzer of the present invention will be described. First, a conventionally known configuration of the cylindrical mirror type energy analyzer (CMA) 60 will be described with reference to FIG. 28. The CMA 60 is used for Auger electron spectroscopy. As shown in FIG. 28(1), the CMA 60 is characterized in a configuration that two cylindrical electrodes (61,62) having different radii are coaxially arranged. Usually, the electron gun 63 is arranged inside the cylindrical electrode 61, and the on-axis sample 65 is irradiated with the electron beam 64. The Auger electrons emitted from the sample 65 by the irradiation of the electron beam 64 pass through the cylindrical grid 66 provided in a part of the inner cylinder and enter the cylindrical symmetric electric field. The electrons are then bent by a cylindrically symmetric electric field, exit the cylindrically symmetric electric field through another cylindrical grid 67 provided on the inner cylinder, and focus on the axis.

In FIG. 28(2), only the trajectories in one plane are drawn, but in reality, electrons are collected over all azimuth angles of 0 to 360°, so that the CMA 60 is known to be an analyzer with a large acceptance solid angle. Assuming that the radius and the potential of the inner cylinder of the CMA 60 are $R_{in}$ and $V_{in}$, respectively, the potential at a position R away from the central axis in the vertical direction is represented by the following equation 1. Here, E is the kinetic energy of an electron, e is an elementary charge, and K is a dimensionless parameter.

[Equation 1]

$$V(R) = \frac{E/e}{K} \ln\left(\frac{R}{R_{in}}\right) + V_{in}$$ [Equation 1]

Figure 29:
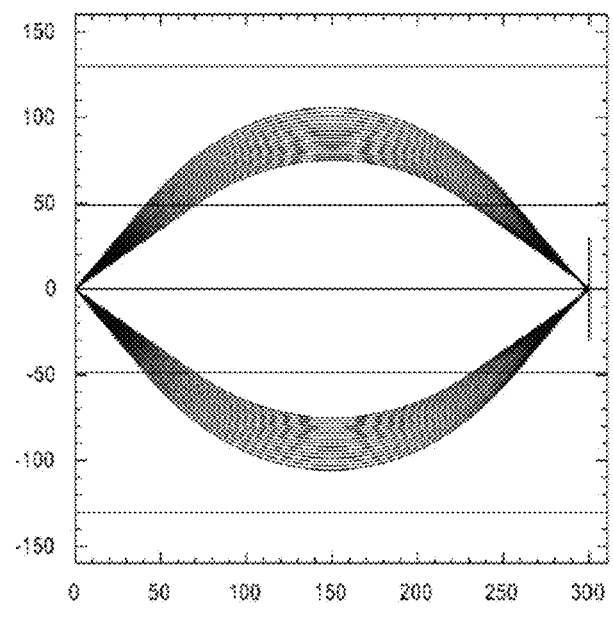
FIG. 29 shows a configuration explanatory view of charged particle trajectories, aberrations, incident angles and emission angles in a conventional cylindrical mirror type energy analyzer.
Figure 29:
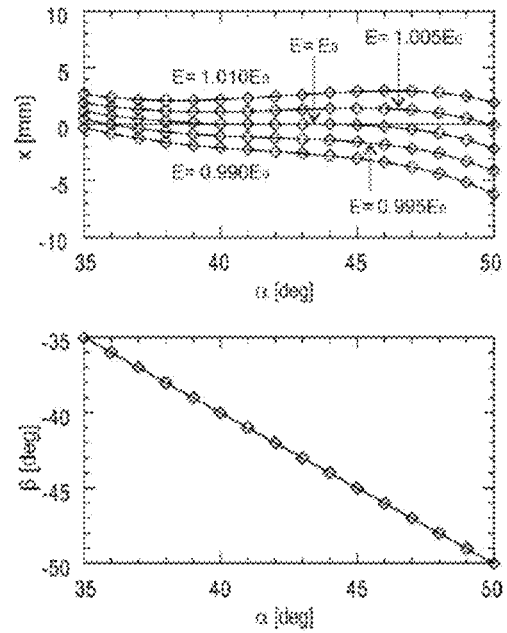
Figure 29:
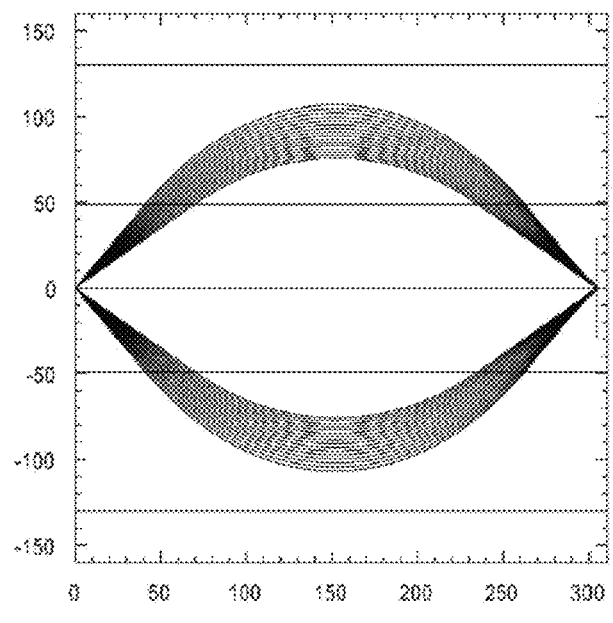
Figure 29:
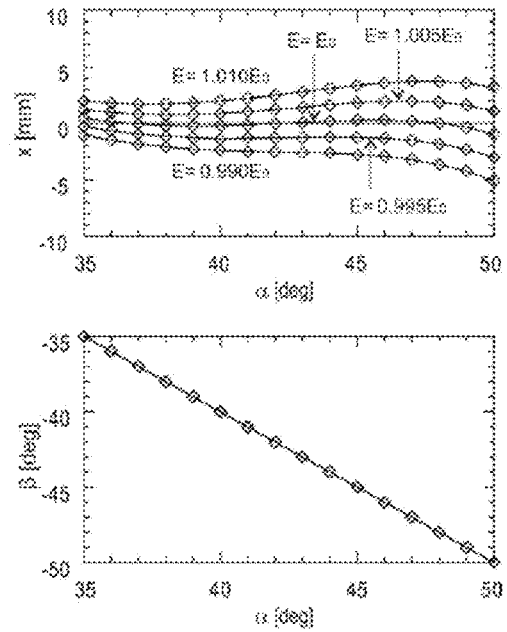

Substituting the radius $R_{out}$ of the outer cylinder and its potential $V_{out}$ (V ($R_{out}$)) into Equation 1 determines the parameter K. FIGS. 29(a) and 29(b) show the electron trajectories (left figures of FIG. 29), aberration curves (upper right figures of FIGS. 29(a) and 29(b)) and a relationship between the incident angle and the emission angle when the parameters K are 1.31 and 1.33, respectively (the lower right figures of FIGS. 29(a) and 29(b)).

Although each left figure of FIGS. 29(a) and 29(b) is shown only for the electrons having the path energy $E_0$, each right figure of FIGS. 29(a) and 29(b) also shows results for electrons with kinetic energies different from the path energy $E_0$, by $E_0 \pm 0.5\%$ and by $E_0 \pm 1\%$.

The difference between K=1.31 in FIG. 29(a) and K=1.33 in FIG. 29(b) can be clearly seen when comparing the aberration curves at E=$E_0$ in the upper right graphs of FIGS. 29(a) and 29(b). When K=1.31, there is one stationary point, whereas when K=1.33, there are two stationary points. As a result, when K=1.31, there is an angle range where the aberration is almost zero, whereas when K=1.33, there is no such angle range. Instead, when K=1.33, the angle range in which the aberration is below a certain degree is larger than that when K=1.31. Note that the stationary point when K=1.31 corresponds to the commonly used incident angle α=42.3°.

As described above, the conventional CMA covers all azimuth angles from 0 to 360°, but as shown by the aberration curves in the upper right figures of FIGS. 29(a) and 29(b), it is seen that the acceptance incident angle range is not so large. When K=1.31, the effective acceptance angle is about 12° (±6°), and even when K=1.33, the effective acceptance angle is about 15° (±7.5°). If this acceptance angle can be widened, it can be expected that the sensitivity and function of the conventional Auger electron spectrometer will be significantly improved.

Figure 20:
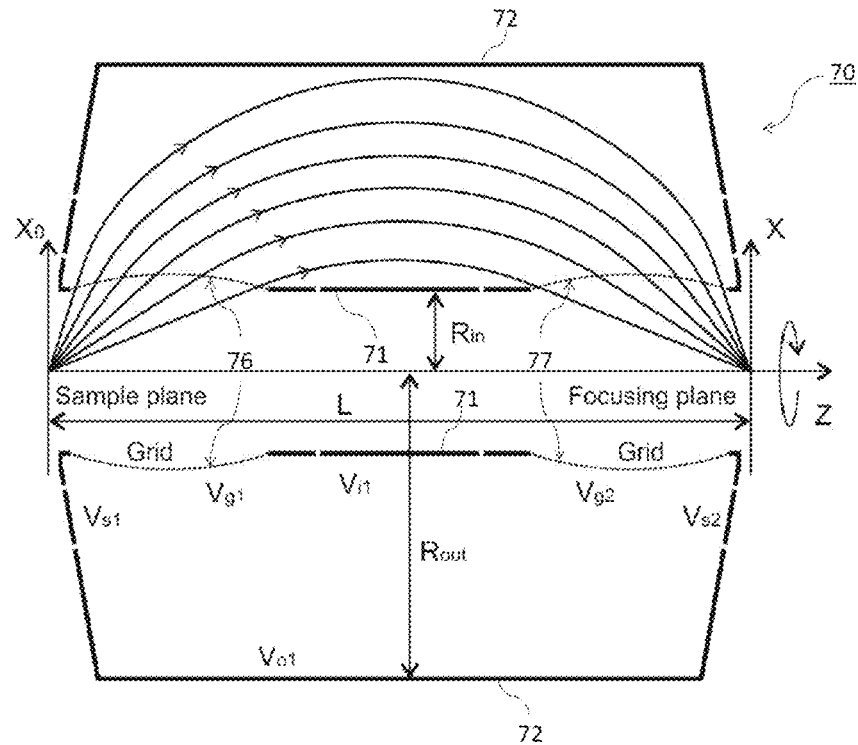
FIG. 20 shows a configuration explanatory view of a wide angle energy analyzer of Embodiment 12.

Next, the wide angle energy analyzer of this Embodiment will be described. FIG. 20 shows the configuration of the wide angle energy analyzer of this Embodiment. In the wide angle energy analyzer 70 shown in FIG. 20, two cylindrical grids used in the conventional CMA are replaced with two toroidal grids (76,77) shaped into toroidal surfaces, and further by making the length of the toroidal grid in the optical axis direction larger than that of the conventional CMA cylindrical grid, it is possible to greatly widen the acceptance angle.

Note that, in the wide angle energy analyzer shown in FIG. 20, only trajectories in one plane are drawn, but in reality, electrons are taken in and dispersed over all azimuth angles of 0 to 360°.

Here, the toroidal surface is a curved surface generated when a circle is rotated about a straight line that does not pass through the center, like a surface of a tire or a donut.

The configuration of the wide angle energy analyzer 70 is similar to that of the CMA (see FIG. 28(1)), in which two cylindrical electrodes (71,72) having different radii are arranged coaxially, and thus the Auger electrons emitted from an on-axis sample plane pass through the toroidal grid 76 provided in a part of the inner cylindrical electrode 71 and enter the rotationally symmetric electric field. The electrons are then bent by a rotationally symmetric electric field, exit the rotationally symmetric electric field through another toroidal grid 77 provided on the inner cylinder, and focus on the axis (Focusing plane).

In FIG. 20, the radius $R_{in}$ of the inner cylinder, the radius $R_{out}$ of the outer cylinder, the potential $V_{i1}$ of the inner cylinder, the potential $V_{O1}$ of the outer cylinder, the potentials $V_{g1}$ $V_{gn2}$ of the two toroidal grids, and the potentials $V_{s1}$ and $V_{s2}$ of the electrodes sandwiched between the outer cylinder and the toroidal grids are adjusted so that the Auger electrons emitted from the sample plane are focused on the axis.

Figure 21:
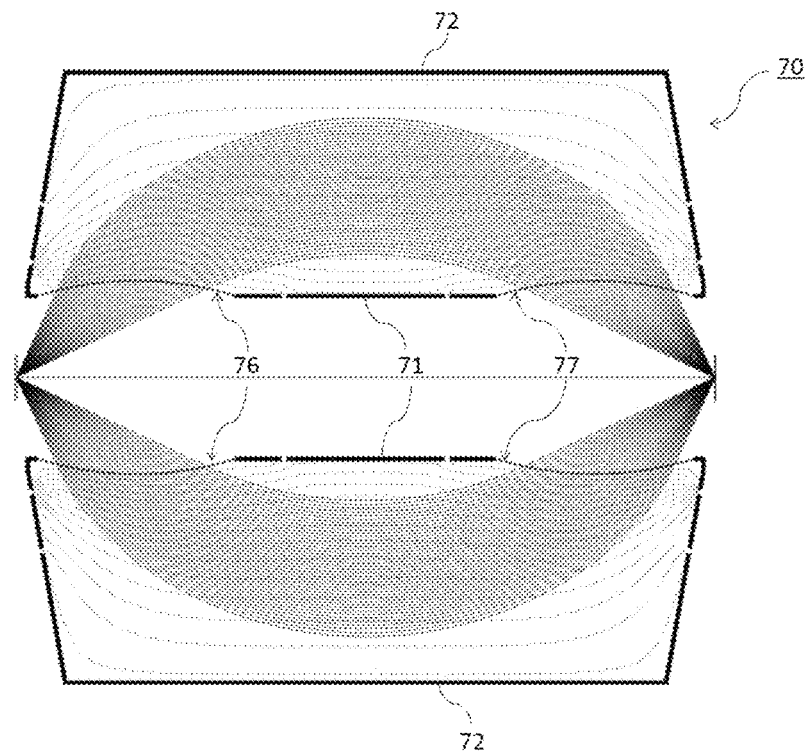
FIG. 21 shows an explanatory view of electron trajectories in a wide angle energy analyzer of Embodiment 12.

FIG. 21 shows an example of the electron trajectories of the wide angle energy analyzer 70. The electron trajectories shown in FIG. 21 are shown only for electrons with path energy $E_0$. Comparing them with the trajectories of the CMA shown in FIG. 28(2), it can be seen that the wide angle energy analyzer has a wider solid angle of electron acceptance.

Figure 22:
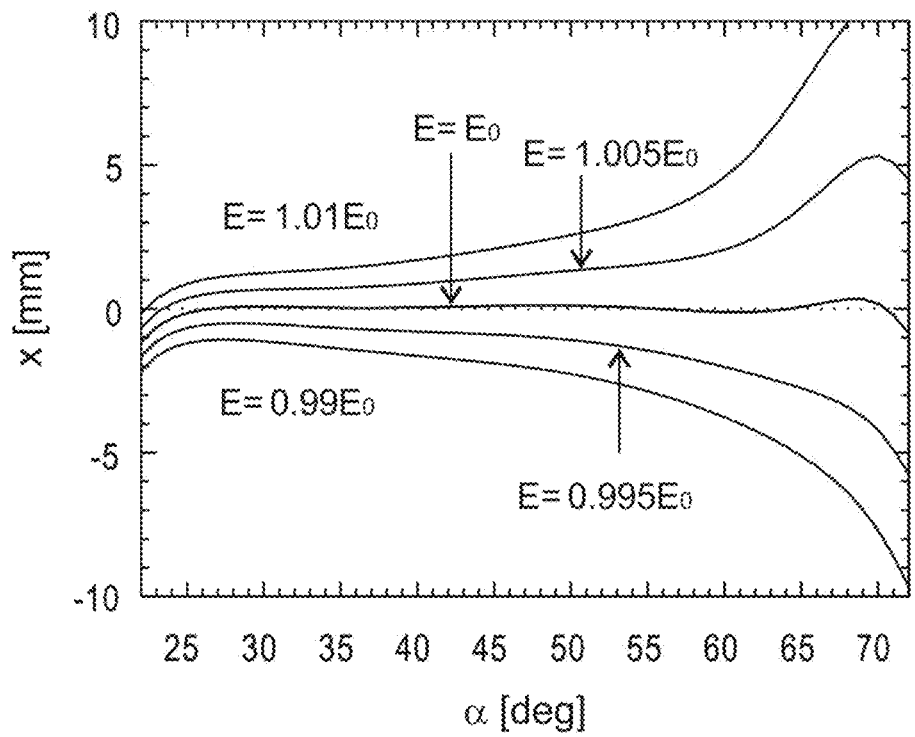
FIG. 22 shows an explanatory view of aberrations, incident angles and emission angles in a wide angle energy analyzer of Embodiment 12.
Figure 22:
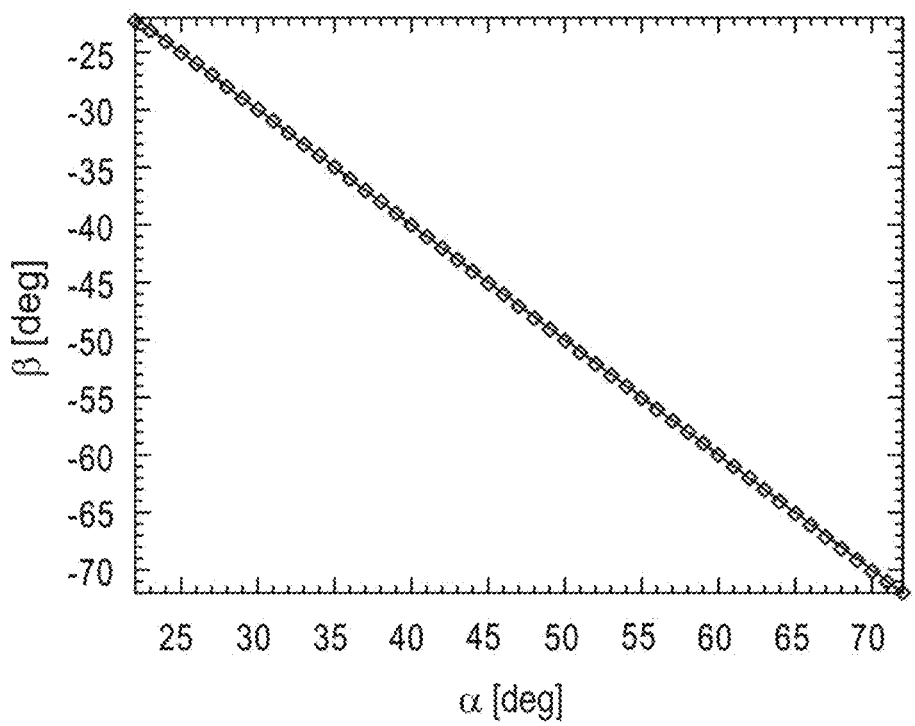

Next, with reference to FIG. 22, the aberration, the incident angle α and the emission angle β of the wide angle energy analyzer of this Embodiment will be described. The wide angle energy analyzer of this Embodiment covers all azimuth angles of 0 to 360°, and as shown by the aberration curve of FIG. 22(a), the effective acceptance angle is about 40° (±20 and it is confirmed that the solid angle of electron acceptance is wide. Further, as shown in FIG. 22(b), the relation between the incident angle and the emission angle is 1 to 1, and it is confirmed that a distortion-free two-dimensional emission angle distribution can be obtained over a wide acceptance solid angle. As described above, the wide angle energy analyzer has a wider solid angle of electron acceptance than the conventional CMA, and the Auger electron spectrometer can be expected to have a significant improvement in sensitivity and function.

Figure 23:
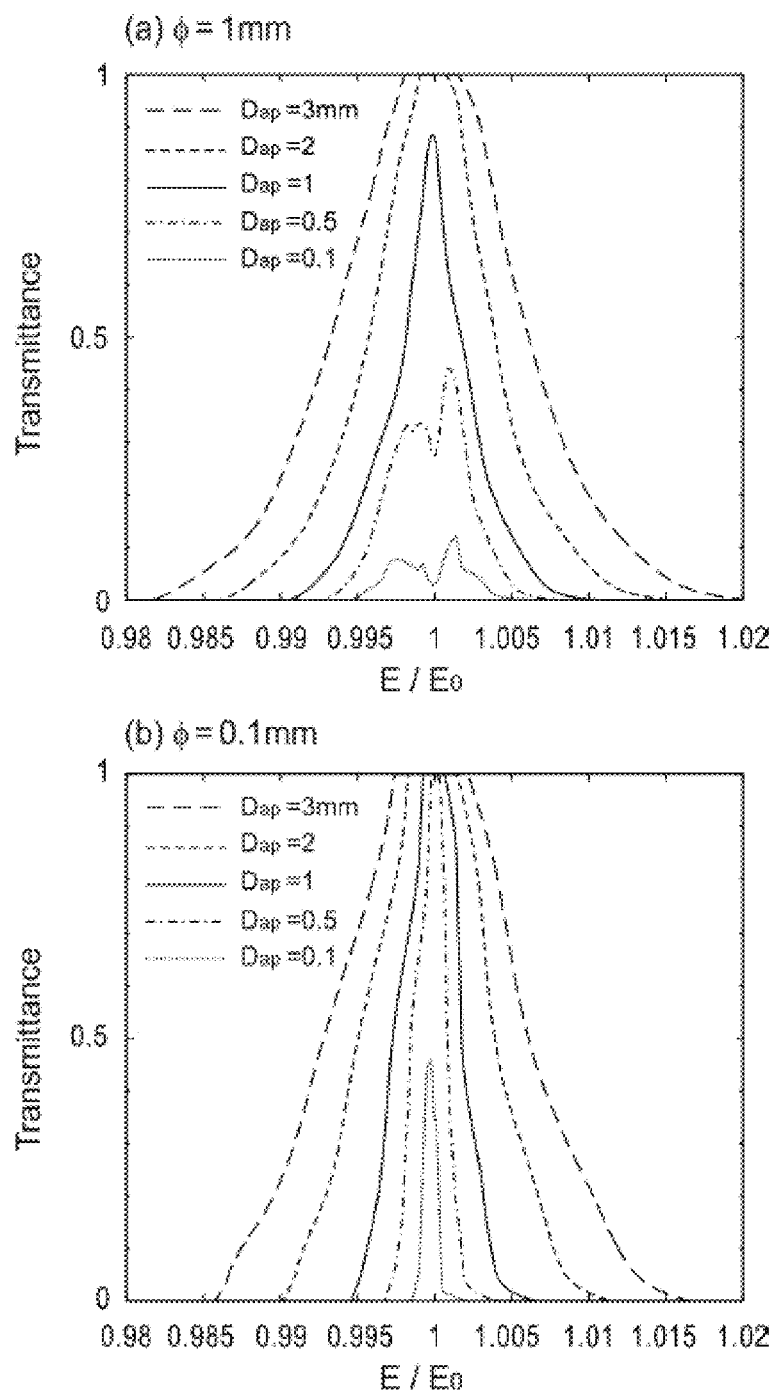
FIG. 23 shows an explanatory view of transmittance of a wide angle energy analyzer of Embodiment 12.

With reference to FIG. 23, the transmittance of the wide angle energy analyzer of this Embodiment will be described. FIGS. 23(a) and 23(b) show the transmittance characteristics of the energy analyzer for cases where the diameter φ of the electron beam for excitation and emission of Auger electrons from the sample is 1 mm and 0.1 mm, respectively. In the graph, the cases where the aperture diameter $D_{ap}$ is 0.1, 0.5, 1, 2, 3 (mm) are drawn with different line types. When the beam diameter φ is 1 mm, the energy resolution is 1% or less when the aperture diameter $D_{ap}$ is about 2 mm or less, but the transmittance is remarkably lowered when the aperture diameter $D_{ap}$ is 0.5 mm or less. On the other hand, when the beam diameter φ is 0.1 mm, the resolution is the same as 1% or less when the aperture diameter $D_{ap}$ is about 2 mm or less, but the transmittance characteristic, even when the aperture diameter $D_{ap}$ is 0.5 mm, turns out to be good.

Figure 24:
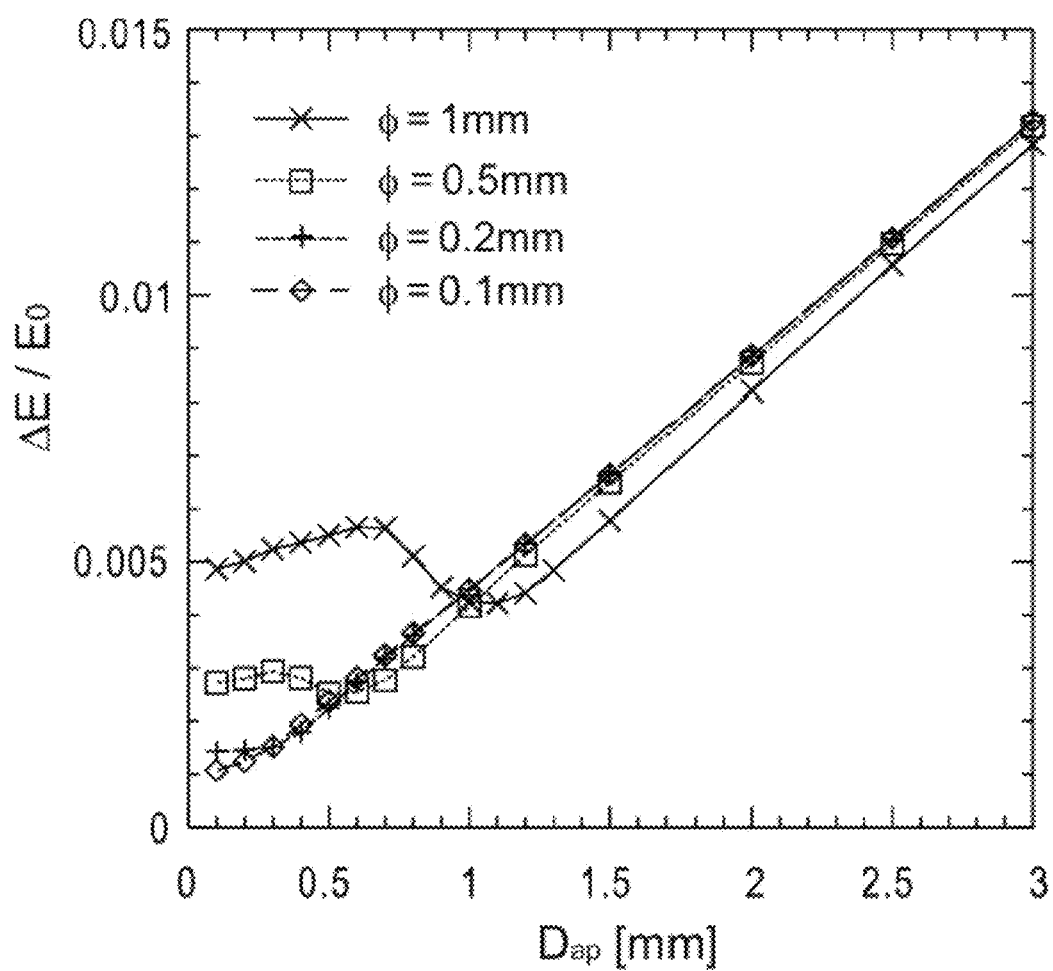
FIG. 24 shows an explanatory view of energy resolution of a wide angle energy analyzer of Embodiment 12.

With reference to FIG. 24, the energy resolution of the wide angle energy analyzer of this Embodiment will be described. From the graph of FIG. 24, it follows that the energy resolution (ΔE / $E_0$) of the wide angle energy analyzer is a function that decreases monotonically with the aperture diameter in a range where the aperture diameter $D_{ap}$ is larger than about 1mm when the diameter φ of the electron beam for excitation and emission of Auger electrons from the sample is 1 mm. Similarly, the energy resolution when the beam diameter φ is 0.5 mm, 0.2 mm, 0.1 mm is a function that monotonically decreases with the aperture diameter in a range where the aperture diameter $D_{ap}$ is larger than about 0.5 mm, 0.2 mm, 0.1 mm, respectively.

It is thus seen that the energy resolution of the wide angle energy analyzer is affected by the beam diameter φ, and the smaller the beam diameter φ is, the better the energy resolution ($\Delta E / E_0$) becomes.

Embodiment 13

Figure 25:
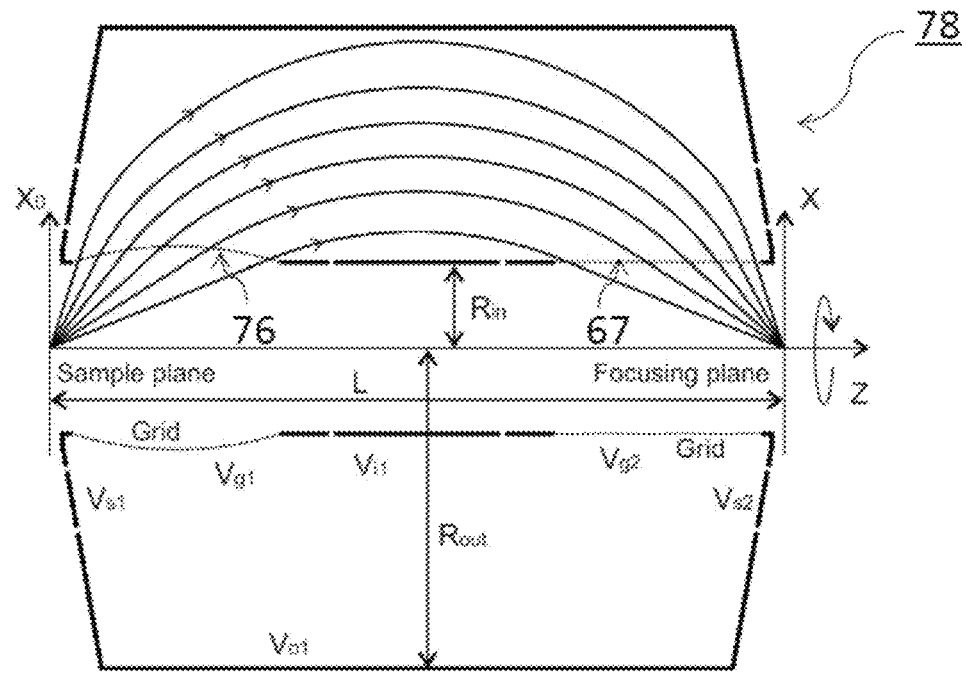
FIG. 25 shows the configuration of a wide angle energy analyzer of the Embodiment 13.
Figure 25:
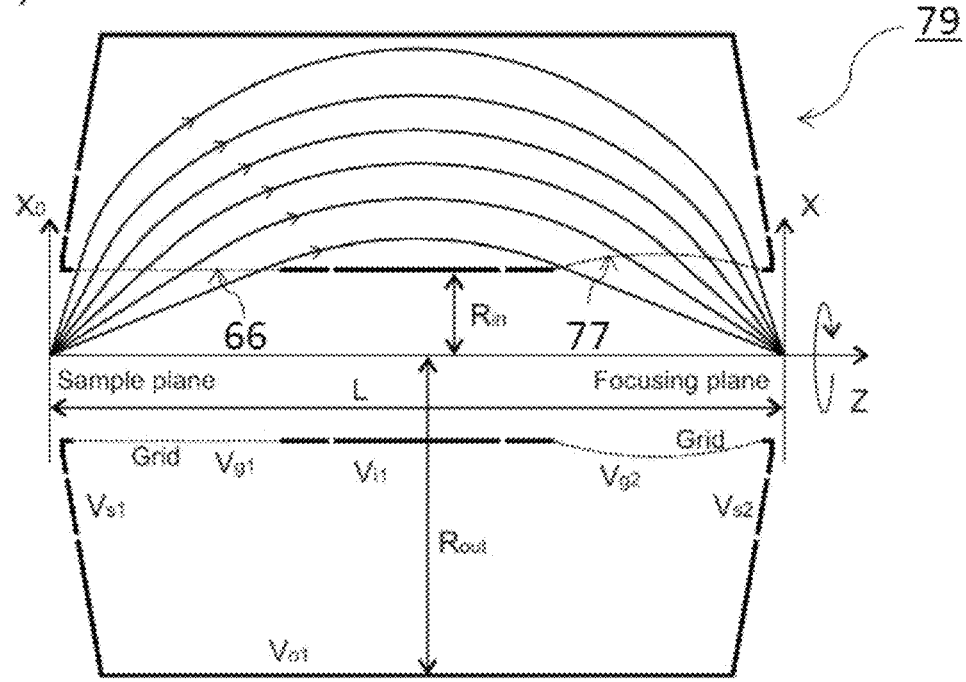

Other Embodiments of the wide angle energy analyzer will be described with reference to FIG. 25.

The wide angle energy analyzer of the Embodiment 12 as described above uses two toroidal grids, but the wide angle energy analyzer of this Embodiment is configured by using one toroidal grid. In the wide angle energy analyzer 78 shown in FIG. 25(a), a toroidal grid 76 is used on the sample plane side, and a cylindrical grid 67 similar to CMA is used on the focusing plane side. On the other hand, in the wide angle energy analyzer 79 shown in FIG. 25(b), a cylindrical grid 66 similar to CMA is used on the sample plane side, and a toroidal grid 77 is used on the focusing plane side. With these configurations, it is possible to collect and focus electrons with a wider acceptance solid angle than those of conventional cylindrical mirror type energy analyzers.

Embodiment 14

Figure 26:
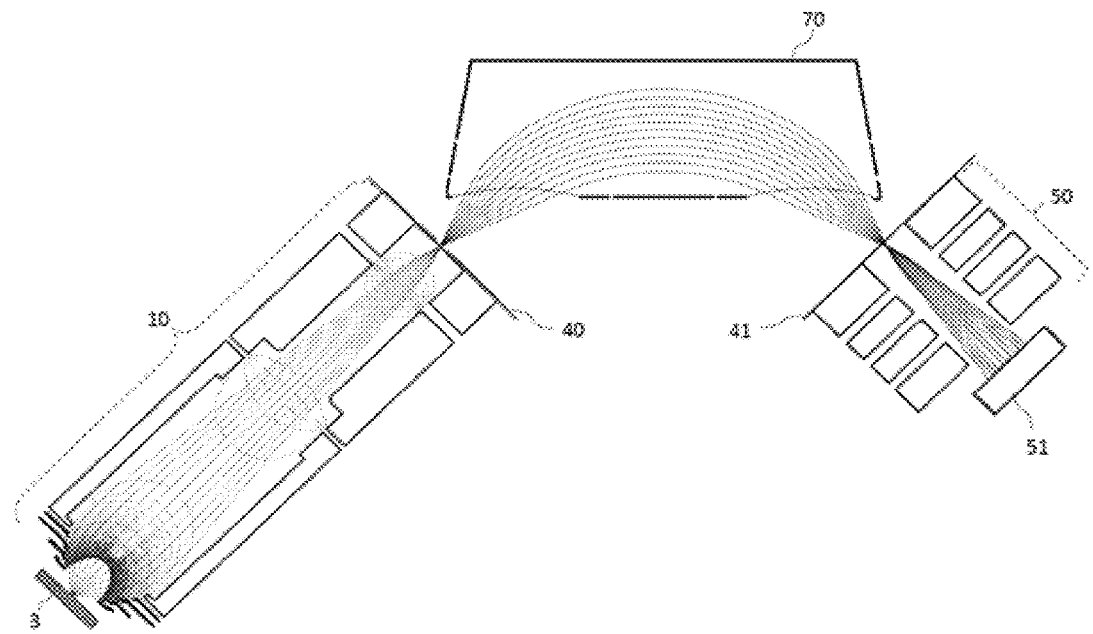
FIG. 26 shows a configuration explanatory view of a two-dimensional electron spectrometer of Embodiment 14.

FIG. 26 shows the configuration of another Embodiment of a two-dimensional electron spectrometer. The two-dimensional electron spectrometer shown in FIG. 26 includes a variable deceleration ratio spherical aberration correction electrostatic lens 10 for 3-step deceleration according to the Embodiment 2, a wide angle energy analyzer 70 for the Embodiment 12, a projection lens 50, and a screen 51. The wide angle energy analyzer 70 of the Embodiment 12 is provided in the subsequent stage of the electrostatic lens 10 via the aperture 40. A projection lens 50 for projecting a two-dimensional emission angle distribution and a magnified image of the sample onto the screen 51 is provided at the subsequent stage of the wide angle energy analyzer 70 of the Embodiment 12 via the aperture 41. Switching between the two-dimensional emission angle distribution and the magnified image is performed by changing the voltage applied to the projection lens 50. A conventional electronic lens can be used as the projection lens 50.

In this Embodiment, the 3-step deceleration variable deceleration ratio spherical aberration correction electrostatic lens of the Embodiment 2 is used, but the 2-step deceleration variable deceleration ratio spherical aberration correction electrostatic lens of the Embodiment 1 and other variable deceleration ratio spherical aberration correction electrostatic lenses of the Embodiments 3 to 8 may be used.

INDUSTRIAL APPLICABILITY

The variable deceleration ratio spherical aberration correction electrostatic lens, wide angle energy analyzer, and two-dimensional electron spectrometer according to the present invention are useful for a measurement of band dispersion at the crystal surface by the angle-resolved photoelectron spectroscopy, Fermi surface mapping, depth direction composition analysis, and atomic structure analysis by electron diffraction, photoelectron diffraction and holography.

DESCRIPTION OF SYMBOLS

1 Point source
2 Aspherical mesh
3 Sample
4 Hole through which the excitation beam passes
5 Exit position
6, 20 Planar grid
7 Metal ring
8 Metal grid
9 Screw hole
10 Electrostatic lens
11 First deceleration electric field
12 Second deceleration electric field
13 Third deceleration electric field
21, 27, 30 Opening plate
24 Openings
25 Rotating plate
26 Rotating shaft
28 Variable aperture diaphragm
29 Ring-shaped frame
40, 41 Aperture
50 Projection lens
51 Screen
60 Cylindrical mirror type energy analyzer (CMA)
61, 62 Cylindrical electrode
66, 67 Cylindrical grid
70, 78, 79 Wide angle energy analyzer
71, 72 Cylindrical electrode
76, 77 Toroidal grid
80 Concentric Hemispherical Analyzer (CHA)
EL0 to EL6 Electrode

What is claimed is:

1. A variable deceleration ratio spherical aberration correction electrostatic lens comprising:
   an electrostatic lens comprising an axisymmetric or substantially axisymmetric non-spherical mesh having a concavity, and one or more substantially axisymmetric electrodes;
   an axisymmetric deceleration field generating electrode disposed coaxially with said electrostatic lens, with a planar grid for forming a deceleration electric field disposed on an exit side of the deceleration electric field;
   said mesh and an electric potential and a position of said electrode being adjusted so that a charged particle generated from a point source is focused at a lens exit by said electrostatic lens; and
   said deceleration field generating electrode being disposed at a fore stage of a focusing point to adjust an applied potential for controlling a deceleration ratio of a charged particle, whereby a focusing angle can be kept almost constant regardless of the deceleration ratio by said planar grid.

2. The variable deceleration ratio spherical aberration correction electrostatic lens as set forth in claim 1, wherein
   said planar grid is equipped with a mechanism for enabling insertion or ejection from outside of said electrostatic lens.

3. The variable deceleration ratio spherical aberration correction electrostatic lens as set forth in claim 1, wherein said planar grid has a plurality of grid-equipped openings having different opening sizes and a switching mechanism of the openings.

4. The variable deceleration ratio spherical aberration correction electrostatic lens as set forth in claim 1, wherein said planar grid has an opening with a grid having a variable opening area, and the size of the grid can be changed by narrowing the opening of the opening area.

5. The variable deceleration ratio spherical aberration correction electrostatic lens as set forth in forth in claim 1, capable of controlling an acceptance angle of charged particles by exchanging said aperture, further comprising a plurality of apertures with different aperture sizes for controlling acceptance angles of charged particles generated at a point source and a switching mechanism of said aperture.

6. The variable deceleration ratio spherical aberration correction electrostatic lens as set forth in claim 1, wherein said deceleration field generating electrode for controlling the deceleration ratio has at least a two-stage configuration.

7. A two-dimensional electron spectrometer composed of the variable deceleration ratio spherical aberration correction electrostatic lens as set forth in claim 1 and a projection lens disposed at an exit side of said electrostatic lens.

8. The two-dimensional electron spectrometer as set forth in claim 7, further comprising a cylindrical mirror type energy analyzer disposed at a lens exit side of said electrostatic lens, and wherein projection lens is disposed at an exit side of said energy analyzer.

9. The two-dimensional electron spectrometer as set forth in claim 7, further comprising a concentric hemispherical energy analyzer disposed at a lens exit side of said electrostatic lens, and wherein said projection lens is disposed at an exit side of said energy analyzer.

10. The two-dimensional electron spectrometer as set forth in claim 8, wherein
said cylindrical mirror type energy analyzer is a wide angle energy analyzer which uses two toroidal grids instead of the two cylindrical grids, and increases the axial length of each grid to increase the acceptance angle of charged particles.

11. The wide angle energy analyzer used in the two-dimensional electron spectrometer as set forth in claim 10.

12. The variable deceleration ratio spherical aberration correction electrostatic lens as set forth in claim 1, wherein said planar grid has a plurality of grid-equipped openings having different opening sizes.

13. The variable deceleration ratio spherical aberration correction electrostatic lens as set forth in claim 1, wherein said planar grid has an opening with a grid having a variable opening area.

14. The variable deceleration ratio spherical aberration correction electrostatic lens as set forth in claim 1, wherein said planar grid is equipped with a mechanism for enabling insertion or ejection from outside of said electrostatic lens, and has a plurality of grid-equipped openings having different opening sizes and a switching mechanism of the openings.

15. A two-dimensional electron spectrometer composed of the variable deceleration ratio spherical aberration correction electrostatic lens as set forth in claim 2 and a projection lens disposed at an exit side of said electrostatic lens.

16. The two-dimensional electron spectrometer as set forth in claim 15, further comprising;
a cylindrical mirror type energy analyzer disposed at a lens exit side of said electrostatic lens, and wherein projection lens is disposed at an exit side of said energy analyzer.

17. The two-dimensional electron spectrometer as set forth in claim 15, further comprising
a concentric hemispherical energy analyzer disposed at a lens exit side of said electrostatic lens, and wherein projection lens is disposed at an exit side of said energy analyzer.

18. The two-dimensional electron spectrometer as set forth in claim 16, wherein
said cylindrical mirror type energy analyzer is a wide angle energy analyzer which uses two toroidal grids instead of the two cylindrical grids, and increases the axial length of each grid to increase the acceptance angle of charged particles.

19. The wide angle energy analyzer used in the two-dimensional electron spectrometer as set forth in claim 18.

* * * * *

UNITED STATES PATENT AND TRADEMARK OFFICE
CERTIFICATE OF CORRECTION

| | | |
|---|---|---|
| PATENT NO. | : 11,791,148 B2 | Page 1 of 1 |
| APPLICATION NO. | : 17/053270 | |
| DATED | : October 17, 2023 | |
| INVENTOR(S) | : Hiroyuki Matsuda et al. | |

It is certified that error appears in the above-identified patent and that said Letters Patent is hereby corrected as shown below:

On the Title Page

Column 1, (22) PCT Filed should read: May 8, 2019

Signed and Sealed this
Second Day of January, 2024

Katherine Kelly Vidal
*Director of the United States Patent and Trademark Office*